(12) United States Patent
Zhao et al.

(10) Patent No.: US 7,187,804 B2
(45) Date of Patent: Mar. 6, 2007

(54) LOSSLESS AND NEAR-LOSSLESS SOURCE CODING FOR MULTIPLE ACCESS NETWORKS

(75) Inventors: Qian Zhao, Pasadena, CA (US); Michelle Effros, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 773 days.

(21) Appl. No.: 10/066,339

(22) Filed: Jan. 30, 2002

(65) Prior Publication Data

US 2002/0176494 A1    Nov. 28, 2002

Related U.S. Application Data

(60) Provisional application No. 60/301,609, filed on Jun. 27, 2001, provisional application No. 60/265,402, filed on Jan. 30, 2001.

(51) Int. Cl.
   *G06K 9/00* (2006.01)
(52) U.S. Cl. ........................................... 382/244
(58) Field of Classification Search ........ 382/232–233, 382/244–253, 238; 375/240–240.29, 241; 358/426.01–426.16; 341/51, 59, 65, 67, 341/107, 79
   See application file for complete search history.

(56) References Cited

U.S. PATENT DOCUMENTS

| | | | |
|---|---|---|---|
| 5,142,283 A | 8/1992 | Chevion et al. | |
| 5,534,861 A | 7/1996 | Chang et al. | |
| 5,751,859 A | 5/1998 | Howard | |
| 5,764,374 A | 6/1998 | Seroussi et al. | |
| 5,818,877 A | 10/1998 | Tsai et al. | |
| 5,848,195 A | 12/1998 | Romriell et al. | |
| 5,959,560 A | 9/1999 | Said et al. | |
| 6,771,831 B2 * | 8/2004 | Effros et al. | 382/251 |

OTHER PUBLICATIONS

Yan et al., On Instantaneous Codes for Zero-Error Coding of Two Correlated Source, IEEE 0-7803-5857-0/00, p. 344.*
Slepian et al., Noisless Coding of Correlated Information Sources, IEEE vol. IT-19, No. 4, p. 471-480.*
Jabri et al., Zero-Error Codes for Correlated Information Sources, EE Dept., College of Engineering King Saud University, p. 17-22.*
Witsenhausen, The Zero Error side Information Problem Chromatic Number, IEEE Transactions on Information Theory Sept 19976, pp. 592-593.*
Vishwanathan et al., Sequential Coding of Crrelated Sources, IEEE 0018-9448/00, pp. 236-245.*
Pradhan et al., Distributed Source Coding Using Syndromes: Design and Construction, IEEE 0018-9448/03, pp. 626-643.*

* cited by examiner

*Primary Examiner*—Ishrat Sherali
(74) *Attorney, Agent, or Firm*—J. D. Harriman, II; DLA Piper US LLP

(57) ABSTRACT

Embodiments of the invention present implementations for multiple access source coding (MASC). One embodiment presents an implementation directed at the lossless side-information case of MASC. Another embodiment gives an implementation of the general case MASC. One embodiment is a near-lossless implementation of MASC. In a two dimensional example, the invention provides a way to decode data pairs (x,y) from encoded individual data streams x and y. The present invention provides a solution that partitions the source code into optimal partitions and then finds a matched code that is optimal for the given partition. Embodiments of the present invention use Optimal Shannon, Huffman and Arithmetic Codes for the matched codes. Another embodiment of the present invention gives a method of finding near-lossless multiple access source coding.

3 Claims, 18 Drawing Sheets

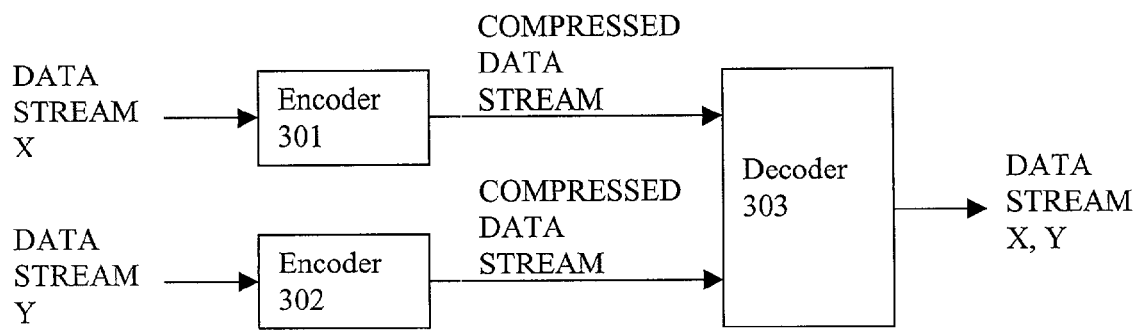
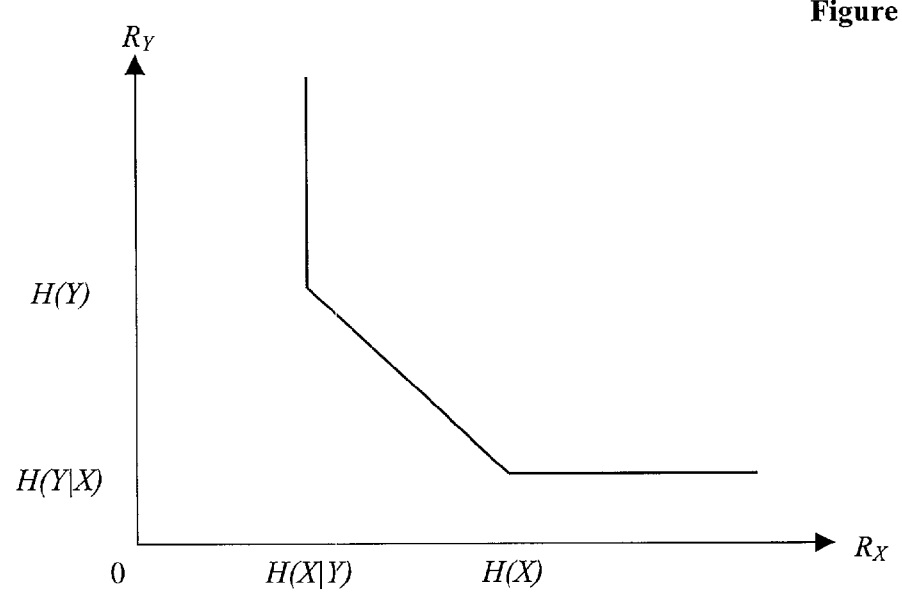
Figure 3A
Figure 3B

Partition trees for (a) $R^*_{SI,H}(Y)$; (b) $R^*_{SI,A}(Y)$; (c) $R'_{SI,A}(Y)$ and $R'_{SI,H}(Y)$.

FIGURE 15  General lossless and near-lossless MASC results.

LOSSLESS AND NEAR-LOSSLESS SOURCE CODING FOR MULTIPLE ACCESS NETWORKS

This application claims priority from provisional applications Nos. 60/265,402 filed Jan. 30, 2001 and 60/301,609 filed Jun. 27, 2001.

BACKGROUND OF THE INVENTION

1. Field of the Invention

The present invention relates to the implementation of lossless and near-lossless source coding for multiple access networks.

2. Background Art

Source Coding

Source coding, also known as data compression, treats the problem of efficiently representing information for data transmission or storage.

Data compression has a wide variety of applications. In the area of data transmission, compression is used to reduce the amount of data transferred between the sources and the destinations. The reduction in data transmitted decreases the time needed for transmission and increases the overall amount of data that can be sent. For example, fax machines and modems all use compression algorithms so that we can transmit data many times faster than otherwise possible. The Internet uses many compression schemes for fast transmission; the images and videos we download from some bulletin boards are usually in a compressed format.

In the area of data storage, data compression allows us to store more information on our limited storage space by efficiently representing the data. For example, digital cameras use image compression schemes to store more photos on their memory cards, DVDs use video and audio compression schemes to store movies on portable disks, we could also utilize text compression schemes to reduce the size of text files on computer hard disks.

In many electronic and computer applications, data is represented by a stream of binary digits called bits (e.g., 0 and 1). Here is an example overview of the steps involved in compressing data for transmission. The compression begins with the data itself at the sender. An encoder encodes the data into a stream with a smaller number of bits. For example, an image file to be sent across a computer network may originally be represented by 40,000 bits. After the encoding the number of bits is reduced to 10,000. In the next step, the encoded data is sent to the destination where a decoder decodes the data. In the example, the 10,000 bits are received and decoded to give a reconstructed image. The reconstructed image may be identical to or different from the original image.

Here is another example of the steps involved in compressing data for storage. In making MP3 audio files, people use special audio compression schemes to compress the music and store them on the compact discs or on the memory of MP3 players. For example, 700 minutes of MP3 music could be stored on a 650 MB CD that normally stores 74 minutes of music without MP3 compression. To listen to the music, we use MP3 players or MP3 software to decode the compressed music files, and get the reconstructed music that usually has worse quality than the original music.

When transmitting digital data from one part of a computer network to another, it is often useful to compress the data to make the transmission faster. In certain networks, known as multiple access networks, current compression schemes have limitations. The issues associated with such systems can be understood by a review of data transmission, compression schemes, and multiple access networks.

Lossless and Lossy Compression

There are two types of compression, lossless and lossy. Lossless compression techniques involve no loss of information. The original data can be recovered exactly from the losslessly compressed data. For example, text compression usually requires the reconstruction to be identical to the original text, since very small differences may result in very different meanings. Similarly, computer files, medical images, bank records, military data, etc., all need lossless compression.

Lossy compression techniques involve some loss of information. If data have been compressed using lossy compression, the original data cannot be recovered exactly from the compressed data. Los Lossy compression is used where some sacrifice in reconstruction fidelity is acceptable in light of the higher compression ratios of lossy codes. For example, in transmitting or storing video, exact recovery of the video data is not necessary. Depending on the required quality of the reconstructed video, various amounts of information loss are acceptable. Lossy compression is widely used in Internet browsing, video, image and speech transmission or storage, personal communications, etc.

One way to measure the performance of a compression algorithm is to measure the rate (average length) required to represent a single sample, i.e. $R=\Sigma_x P(x)l(x)$, where $l(x)$ is the length of the codeword for symbol $x$, $P(x)$ is the probability of $x$. Another way is to measure the distortion, i.e., the average difference between the original data and the reconstruction.

Fixed-length Code

A fixed-length code uses the same number of bits to represent each symbol in the alphabet. For example, ASCII code is a fixed-length code: it uses 7 bits to represent each letter. The codeword for letter a is 1000011, that for letter A is 1000001, etc.

Variable-length Code

A variable-length code does not require that all codewords have the same length, thus we may use different number of bits to represent different symbols. For example, we may use shorter codewords for more frequent symbols, and longer codewords for less frequent symbols; thus on average we could use fewer bits per symbol. Morse code is an example of a variable-length code for the English alphabet. It uses a single dot (.) to represent the most frequent letter E, and four symbols: dash, dash, dot, dash (--.-)to represent the much less frequent letter Q.

Non-singular, Uniquely Decodable, Instantaneous, Prefix-free Code

TABLE 1

Classes of Codes

| Symbols | P(X) | Singular | Non-singular, but not | Uniquely decodable, | Instantaneous |
|---|---|---|---|---|---|
| 1 | 0.45 | 0 | 1 | 1 | 1 |
| 2 | 0.25 | 0 | 10 | 10 | 01 |
| 3 | 0.1 | 1 | 0 | 100 | 001 |
| 4 | 0.2 | 10 | 110 | 000 | 000 |

A non-singular code assigns a distinct codeword to each symbol in the alphabet. A non-singular code provides us with an unambiguous description of each single symbol. However, if we wish to send a sequence of symbols, a non-singular code does not promise an unambiguous description. For the example given in Table 1, the first code assigns identical codewords to both symbol '1' and symbol '2', and thus is a singular code. The second code is a non-singular code, however, the binary description of the sequence '12' is '110', which is the same as the binary description of sequence '113' and that of symbol '4'. Thus we cannot uniquely decode those sequences of symbols.

We define uniquely decodable codes as follows. A uniquely decodable code is one where no two sequences of symbols have the same binary description. That is to say, any encoded sequence in a uniquely decodable code has only one possible source sequence producing it. However, one may need to look at the entire encoded bit string before determining even the first symbol from the corresponding source sequence. The third code in Table 1 is an example of a uniquely decodable code for the source alphabet. On receiving encoded bit '1', one cannot determine which of the three symbols '1', '2', '3' is transmitted until future bits are received.

Instantaneous code is one that can be decoded without referring to future codewords. The third code is not instantaneous since the binary description of symbol '1' is the prefix of the binary description of symbols '2' and '3', and the description of symbol '2' is also the prefix of the description of symbol '3'. We call a code a prefix code if no codeword is a prefix of any other codewords. A prefix code is always an instantaneous code; since the end of a codeword is always immediately recognizable, it can separate the codewords without looking at future encoded symbols. An instantaneous code is also a prefix code, except for the case of multiple access source code where instantaneous code does not need to be prefix free (we will talk about this later). The fourth code in Table 1 gives an example of an instantaneous code that has the prefix free property.

The nesting of these definitions is: the set of instantaneous codes is a subset of the set of uniquely decodable codes, which is a subset of the set of non-singular codes.

Tree Representation

We can always construct a binary tree to represent a binary code. We draw a tree that starts from a single node (the root) and has a maximum of two branches at each node. The two branches correspond to '0' and '1' respectively. (Here, we adopt the convention that the left branch corresponds to '0' and the right branch corresponds to '1'.) The binary trees for the second to the fourth code in Table 1 are shown in trees 100, 101 and 102 of FIG. 1 respectively.

The codeword of a symbol can be obtained by traversing from the root of the tree to the node representing that symbol. Each branch on the path contributes a bit ('0' from each left branch and '1' from each right branch) to the codeword. In a prefix code, the codewords always reside at the leaves of the tree. In a non-prefix code, some codewords will reside at the internal nodes of the tree.

For prefix codes, the decoding process is made easier with the help of the tree representation. The decoder starts from the root of the tree. Upon receiving an encoded bit, the decoder chooses the left branch if the bit is '0' or the right branch if the bit is '1'. This process continues until the decoder reaches a tree node representing a codeword. If the code is a prefix code, the decoder can then immediately determine the corresponding symbol.

Block Code

In the example given in Table 1, each single symbol ('1', '2', '3', '4') is assigned a codeword. We can also group the symbols into blocks of length n, treat each block as a super symbol in the extended alphabet, and assign each super symbol a codeword. This code is called a block code with block length n (or coding dimension n). Table 2 below gives an example of a block code with block length n=2 for the source alphabet given in Table 1.

TABLE 2

| Block of Symbols | Probability | Code |
| --- | --- | --- |
| 11 | 0.2025 | 00 |
| 12 | 0.1125 | 010 |
| 13 | 0.045 | 10010 |
| 14 | 0.09 | 1000 |
| 21 | 0.1125 | 111 |
| 22 | 0.0625 | 1101 |
| 23 | 0.025 | 11001 |
| 24 | 0.05 | 0111 |
| 31 | 0.045 | 10110 |
| 32 | 0.025 | 101110 |
| 33 | 0.01 | 110001 |
| 34 | 0.02 | 110000 |
| 41 | 0.09 | 1010 |
| 42 | 0.05 | 0110 |
| 43 | 0.02 | 101111 |
| 44 | 0.04 | 10011 |

Huffman Code

A Huffman code is the optimal (shortest average length) prefix code for a given distribution. It is widely used in many compression schemes. The Huffman procedure is based on the following two observations for optimal prefix codes. In an optimal prefix code:

1. Symbols with higher probabilities have codewords no longer than symbols with lower probabilities.
2. The two longest codewords have the same length and differ only in the last bit; they correspond to the two least probable symbols.

Thus the two leaves corresponding to the two least probable symbols are offsprings of the same node.

The Huffman code design proceeds as follows. First, we sort the symbols in the alphabet according to their probabilities. Next we connect the two least probable symbols in the alphabet to a single node. This new node (representing a new symbol) and all the other symbols except for the two least probable symbols in the original alphabet form a reduced alphabet; the probability of the new symbol is the sum of the probabilities of its offsprings (i.e. the two least probable symbols). Then we sort the nodes according to their probabilities in the reduced alphabet and apply the same rule to generate a parent node for the two least probable symbols in the reduced alphabet. This process continues until we get a single node (i.e. the root). The codeword of a symbol can be obtained by traversing from the root of the tree to the leaf representing that symbol. Each branch on the path contributes a bit ('0' from each left branch and '1' from each right branch) to the codeword.

The fourth code in Table 1 is a Huffman code for the example alphabet. The procedure of how we build it is shown in FIG. 2A.

Entropy Code

The entropy of source X is defined as: $H(X) = -\Sigma_x p(x) \log p(x)$. Given a probability model, the entropy is the lowest rate at which the source can be losslessly compressed.

The rate R of the Huffman code for source X is bounded below by the entropy $H(X)$ of source X and bounded above by the entropy plus one bit, i.e., $H(X) \leq R < H(X)+1$. Consider data sequence $X^n = (X_1, X_2, X_3, \ldots, X_n)$ where each element of the sequence is independently and identically generated. If we code sequence $X^n$ using Huffman code, the resulting rate (average length per symbol) satisfies:

$$\frac{H(X)}{n} \le R < \frac{H(X)+1}{n}.$$

Thus when the block length (or coding dimension) n is arbitrarily large, the achievable rate is arbitrarily close to the entropy H(X). We call this kind of code 'entropy code', i.e., code whose rate is arbitrarily close to the entropy when coding dimension is arbitrarily large.

Arithmetic Code

Arithmetic code is another, increasingly popular, entropy code that is used widely in many compression schemes. For example, it is used in the compression standard JPEG-2001.

We can achieve efficient coding by using long blocks of source symbols. For example, for the alphabet given in Table 1, its Huffman code rate is 1.85 bits per symbol. Table 2 gives an example of a Huffman code for the corresponding extended alphabet with block length two; the resulting rate is 1.8375 bits per symbol showing performance improvement. However, Huffman coding is not a good choice for coding long blocks of symbols, since in order to assign codeword for a particular sequence with length n, it requires calculating the probabilities of all sequences with length n, and constructing the complete Huffman coding tree (equivalent of assigning codewords to all sequences with length n). Arithmetic coding is a better scheme for block coding; it assigns codeword to a particular sequence with length n without having to generate codewords for all sequences with length n. Thus it is a low complexity, high dimensional coding scheme.

In arithmetic coding, a unique identifier is generated for each source sequence. This identifier is then assigned a unique binary code. In particular, data sequence $X^n$ is represented by an interval of the [0,1) line. We describe $X^n$ by describing the mid-point of the corresponding interval to sufficient accuracy to avoid confusion with neighboring intervals. This mid-point is the identifier for $X^n$. We find the interval for $x^n$ recursively, by first breaking [0,1) into intervals corresponding to all possible values of $x_1$, then breaking the interval for the observed $X_1$ into subintervals corresponding to all possible values of $X_1 x_2$, and so on. Given the interval $A \subseteq [0,1]$ for $X^k$ for some $0 \le k < n$ (the interval for $X^0$ is [0,1)), the subintervals for $\{X_k x_{k+1}\}$ are ordered subintervals of A with lengths proportional to $p(x_{k+1})$.

For the alphabet given in Table 1, FIG. 2B shows how to determine the interval for sequence '132'. Once the interval [0.3352, 0.3465] is determined for '132', we can use binary code to describe the mid-point 0.34085 to sufficient accuracy as the binary representation for sequence '132'.

In arithmetic coding, the description length of data sequence $x^n$ is $l(x^n) = \lceil -\log p_X(x^n) \rceil + 1$ where $p_X(x^n)$ is the probability of $x^n$; this ensures the interval corresponding to different codewords are disjoint and the code is prefix free. Thus the average rate per symbol for arithmetic code is $R = 1/n \Sigma_x p_X(x^n) l(x^n) = 1/n \Sigma_x p_X(x^n)(\lceil -\log p_X(x^n) \rceil + 1)$. Rate R is then bounded as:

$$\frac{H(X)}{n} \le R < \frac{H(X)+2}{n},$$

which shows R is arbitrarily close to the source entropy when coding dimension n is arbitrarily large.

Multiple Access Networks

A multiple access network is a system with several transmitters sending information to a single receiver. One example of a multiple access system is a sensor network, where a collection of separately located sensors sends correlated information to a central processing unit. Multiple access source codes (MASCs) yield efficient data representation for multiple access systems when cooperation among the transmitters is not possible. An MASC can also be used in data storage systems, for example, archive storage systems where information stored at different times is independently encoded but all information can be decoded together if this yields greater efficiency.

In the MASC configuration (also known as the Slepian-Wolf configuration) depicted in FIG. 3A, two correlated information sequences $\{X_i\}_{i=1}^{\infty}$ and $\{Y_i\}_{i=1}^{\infty}$ are drawn i.i.d. (independently and identically distributed) according to joint probability mass function (p.m.f.) p(x,y). The encoder for each source operates without knowledge of the other source. The decoder receives the encoded bit streams from both sources. The rate region for this configuration is plotted in FIG. 3B. This region describes the rates achievable in this scenario for sufficiently large coding dimension and decoding error probability $P_e^{(n)}$ approaching zero as the coding dimension grows. Making these ideas applicable in practical network communications scenarios requires MASC design algorithms for finite dimensions. We consider two coding scenarios: first, we consider lossless ($P_e^{(n)}=0$) MASC design for applications where perfect data reconstruction is required; second, we consider near-lossless ($P_e^{(n)}$ is small but non-zero) code design for use in lossy MASCs.

The interest in near-lossless MASCs is inspired by the discontinuity in the achievable rate region associated with going from near-lossless to truly lossless coding. For example, if p(x,y)>0 for all (x,y) pairs in the product alphabet, then the optimal instantaneous lossless MASC achieves rates bounded below by H(X) and H(Y) in its descriptions of X and Y, giving a total rate bounded below by H(X)+H(Y). In contrast, the rate of a near-lossless MASC is bounded below by H(X,Y), which may be much smaller than H(X)+H(Y). This example demonstrates that the move from lossless coding to near-lossless coding can give very large rate benefits. While nonzero error probabilities are unacceptable for some applications, they are acceptable on their own for some applications and within lossy MASCs in general (assuming a suitably small error probability). In lossy MASCs, a small increase in the error probability increases the code's expected distortion without causing catastrophic failure.

MASC Versus Traditional Compression

To compress the data used in a multiple access network using conventional methods, people do independent coding on the sources, i.e., the two sources X and Y are independently encoded by the two senders and independently decoded at the receiver. This approach is convenient, since it allows for direct application of traditional compression techniques to a wide variety of multiple access system applications. However, this approach is inherently flawed because it disregards the correlation between the two sources.

MASC on the contrary, takes advantage of the correlation among the sources; it uses independent encoding and joint decoding for the sources. (Joint encoding is prohibited because of the isolated locations of the source encoders or some other reasons.)

For lossless coding, the rates achieved by the traditional approach (independent encoding and decoding) are bounded below by $H(X)$ and $H(Y)$ for the two sources respectively, i.e. $R_X \geq H(X)$, and $R_X+R_Y \geq H(X)+H(Y)$. The rates achieved by MASC are bounded as follows:

$$R_X \geq H(X|Y)$$

$$R_Y \geq H(Y|X)$$

and $$R_X+R_Y \geq H(X,Y).$$

When X and Y are correlated, $H(X)>H(X|Y)$, $H(Y)>H(Y|X)$ and $H(X)+H(Y)>H(X,Y)$. Thus, MASCs can generally achieve better performance than the traditional independent coding approach.

Prior Attempts

A number of prior art attempts have been made to provide optimal codes for multiple access networks. Examples including H. S. Witsenhausen. "The Zero-Error Side Information Problem And Chromatic Numbers." IEEE Transactions on Information Theory, 22:592–593, 1976; A. Kh. Al Jabri and S. Al-Issa. "Zero-Error Codes For Correlated Information Sources". In Proceedings of Cryptography, pages 17–22, Cirencester, UK, December 1997; S. S. Pradhan and K. Ramchandran. "Distributed Source Coding Using Syndromes (DISCUS) Design And Construction". In Proceedings of the Data Compression Conference, pages 158–167, Snowbird, Utah, March 1999. IEEE; and, Y. Yan and T. Berger. "On Instantaneous Codes For Zero-Error Coding Of Two Correlated Sources". In Proceedings of the IEEE International Symposium on Information Theory, page 344, Sorrento, Italy, June 2000. IEEE.

Witsenhausen, Al Jabri, and Yan treat the problem as a side information problem, where both encoder and decoder know X, and the goal is to describe Y using the smallest average rate possible while maintaining the unique decodability of Y given the known value of X. Neither Witsenhausen nor Al Jabri is optimal in this scenario, as shown in Yan. Yan and Berger find a necessary and sufficient condition for the existence of a lossless instantaneous code with a given set of codeword lengths for Y when the alphabet size of X is two. Unfortunately their approach fails to yield a necessary and sufficient condition for the existence of a lossless instantaneous code when the alphabet size for X is greater than two. Prandhan and Ramchandran tackle the lossless MASC code design problem when source Y is guaranteed to be at most a prescribed Hamming distance from source X. Methods for extending this approach to design good codes for more general p.m.f.s $p(x,y)$ are unknown.

SUMMARY OF THE INVENTION

Embodiments of the invention present implementations for multiple access source coding (MASC). The invention provides a solution for independently encoding individual sources and for decoding multiple source data points from the individually encoded streams in a single decoder. In a two source example, the invention provides a way to separately encode samples from data source x and date source y—using no collaboration between the encoders and requiring no knowledge of y by the encoder of x or vice versa—and a way to decode data pairs (x,y) using the individual encoded data streams for both x and y.

Embodiments of the present invention disclosed herein include algorithms for:

1. optimal lossless coding in multiple access networks (the extension of Huffman coding to MASCs);
2. low complexity, high dimension lossless coding in multiple access networks (the extension of arithmetic coding to MASCs);
3. optimal near-lossless coding in multiple access networks (the extension of the Huffman MASC algorithm for an arbitrary non-zero probability of error);
4. low complexity, high dimensional near-lossless coding in multiple access networks (the extension of the arithmetic MASC algorithm for an arbitrary non-zero probability of error).

The algorithmic description includes methods for encoding, decoding, and code design for an arbitrary p.m.f. $p(x,y)$ in each of the above four scenarios.

Other embodiments of the present invention are codes that give (a) identical descriptions and/or (b) descriptions that violate the prefix condition to some symbols. Nonetheless, the codes described herein guarantee unique decodability in lossless codes or near lossless codes with $P_e<\epsilon$ ($\epsilon$ fixed at code design in "near-lossless" codes). Unlike prior art which only discusses properties (a) and (b), the present invention gives codes that yield both types of descriptions. The present invention also gives definition of the class of algorithmns that can be used to generate the codes with properties (a) and (b).

One embodiment of the present invention provides a solution that partitions the source code into optimal partitions and then finds a matched code that is optimal for the given partition, in accordance to the aforementioned definition of the class of algorithmns. In one embodiment the source alphabet is examined to find combinable symbols and to create subsets of combinable symbols. These subsets are then partitioned into optimal groups and joined in a list. The successful groups from the list are then used to create complete and non-overlapping partitions of the alphabet. For each complete and non-overlapping partition, an optimal matched code is generated. The partition whose matched code provides the best rate is selected. In one embodiment, the matched code can be a Huffman code, an arithmetic code or any other existing form of lossless code.

Embodiments of the present invention can be used to provide lossless and near-lossless compression for a general compression solution for environments where multiple encoders encode information to be decoded by a single decoder or for environments where one or more encoders encode information to be decoded by a single decoder to which side information is available.

BRIEF DESCRIPTION OF THE DRAWINGS

These and other features, aspects and advantages of the present invention will become better understood with regard to the following description, appended claims and accompanying drawings where:

FIG. 3A shows an example MASC configuration.

FIG. 3B shows the achievable rate region of multiple access source coding according to the work of Slepian-Wolf.

DETAILED DESCRIPTION OF THE INVENTION

Figure 1:
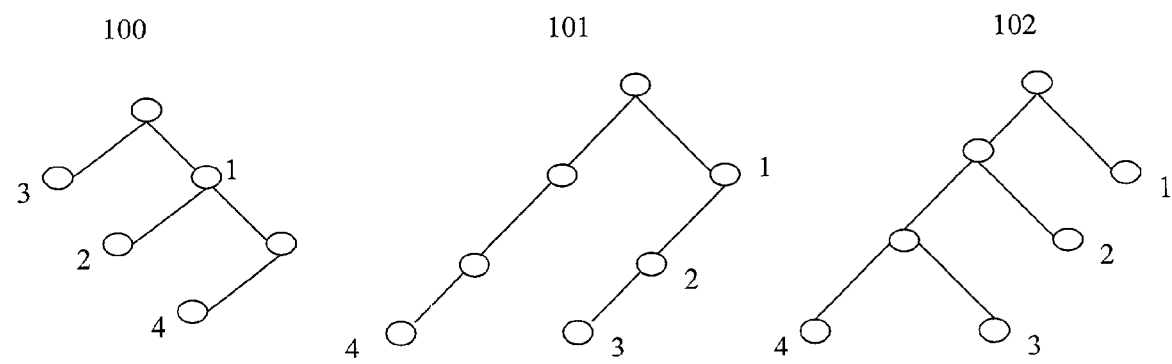
FIG. 1 shows the binary trees for the second to the fourth code in Table 1.
Figure 2A:
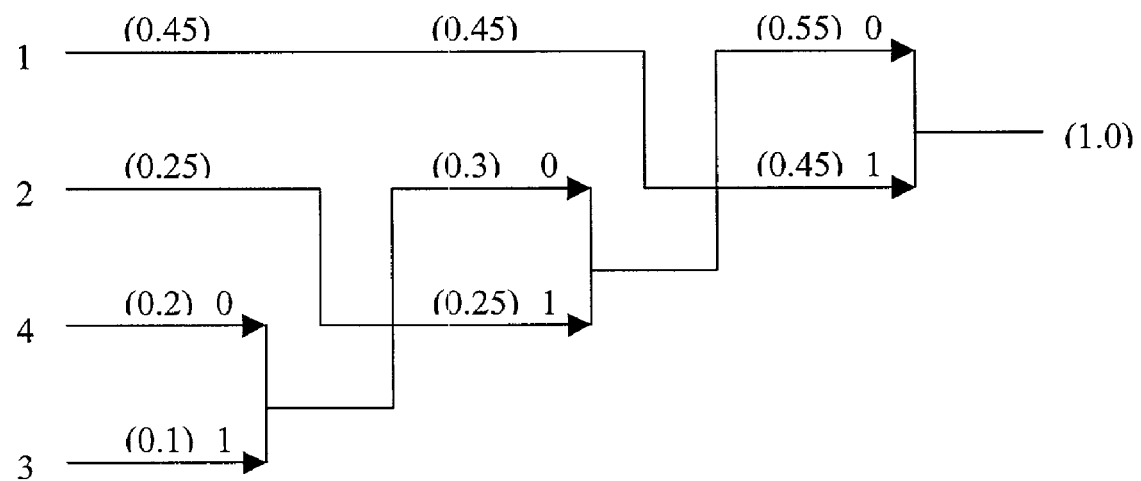
FIG. 2A illustrates an example Huffman code building process.
Figure 2B:
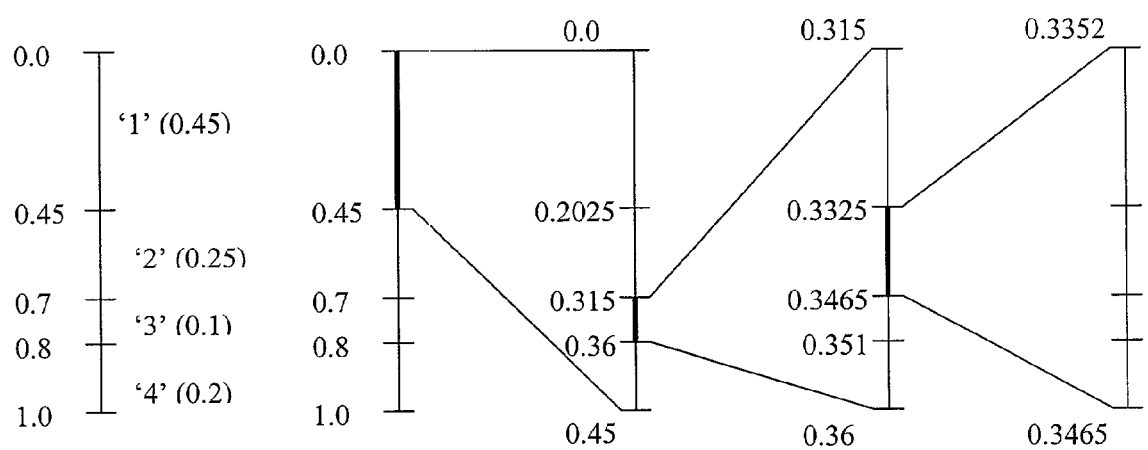
FIG. 2B illustrates an example sequence determination process for Arithmetic coding.

Embodiments of the present invention relate to the implementation of lossless and near-near-lossless source coding for multiple access networks. In the following description, numerous specific details are set forth to provide a more thorough description of embodiments of the invention. It will be apparent, however, to one skilled in the art, that embodiments of the invention may be practiced without these specific details. In other instances, well known features have not been described in detail so as not to obscure the invention.

The invention provides a general data compression scheme for encoding and decoding of data from multiple sources that have been encoded independently. The invention can also be implemented in a side-information environment where one of the data sources is known to the decoder. Although the invention is a general solution for multiple data sources, the invention is described by an example of a two data source network.

The present invention is described herein and by way of example to two data sources X and Y that provide data stream $x_1, x_2, x_3, \ldots x_n$ and data stream $y_1, y_2, y_3, \ldots y_n$ respectively to dedicated encoders. The streams are provided to a single decoder that can produce decoded data pairs $(x_n, y_n)$. Before describing embodiments of the invention, a summary of notations used in the example of the MASC problem is provided.

Notations in MASC

In describing the multiple access source coding (MASC) problem, we consider finite-alphabet memoryless data sources X and Y with joint probability mass function $p(x,y)$ on alphabet X×Y. We use $p_X(x)$ and $p_Y(y)$ to denote the marginals of $p(x,y)$ with respect to X and Y. (The subscripts are dropped when they are obvious from the argument, giving $p_X(x)=p(x)$ and $p_Y(y)=p(y)$). A lossless instantaneous MASC for joint source (X,Y) consists of two encoders $\gamma X: X \to \{0,1\}^\star$ and $\gamma Y: Y \to \{0,1\}^\star$ and a decoder $\gamma^{-1}: \{0,1\}^\star \times \{0,1\}^\star \to X \times Y$. Here a first dedicated encoder $\gamma X$ is encoding data source X which has alphabet x into strings of 0's and 1's (bits). A second dedicated encoder $\gamma Y$ is doing the same for data source y which has alphabet Y. Then a single decoder $\gamma^{-1}$ recovers x and y from the encoded data streams. $\gamma_X(x)$ and $\gamma_Y(y)$ denote the binary descriptions of x and y and the probability of decoding error is $P_e = \Pr(\gamma^{-1}(\gamma_X(X), \gamma_Y(Y)) \neq (X,Y))$. $P_e$ is the probability of occurrence for the discrepancy between the decoded data and the original data. Here, we focus on instantaneous codes, where for any input sequences $x_1, x_2, x_3 \ldots$ and $y_1, y_2, y_3 \ldots$ with $p(x_1, y_1) > 0$ the instantaneous decoder reconstructs $(x_1, y_1)$ by reading only the first $|\gamma_X(x_1)|$ bits from $\gamma_X(x_1)\gamma_X(x_2)\gamma_X(x_3) \ldots$ and the first $|\gamma_Y(Y_1)|$ bits from $\gamma_Y(Y_1)\gamma_Y(Y_2)\gamma_Y(Y_3) \ldots$ (without prior knowledge of these lengths).

The present invention provides coding schemes for the extension of Huffman coding to MASCs (for optimal lossless coding and for near-lossless coding), the extension of arithmetic coding to MASCs (for low complexity, high dimension lossless coding and for near-lossless coding). The embodiments of the invention are described with respect to two environments, one, lossless side-information coding, where one of the data sources is known to the decoder, and another environment, the general case, where neither of the sources must be independently decodable.

To further describe this embodiment of the present invention, we begin by developing terminology for describing, for a particular code, which symbols from Y have binary descriptions that are identical and which have binary descriptions that are prefixes of each other. This embodiment of the present invention defines a "group" for which codes can be designed to describe its nested structure instead of designing codes for symbols. The invention also defines partitions, which are optimal for a particular coding scheme (Huffman coding or arithmetic coding). Finally, the invention describes matched codes which satisfy particular properties for partitions and coding schemes. The goal in code design in the present application is to find the code that minimizes $\lambda R_X + (1-\lambda) R_Y$ for an arbitrary value of $\lambda \in [0,1]$. The result is codes with intermediate values of $R_X$ and $R_Y$. In some cases the goal is to design code that minimizes $\lambda R_X + (1-\lambda) R_Y$ with probability of error no greater than $P_e$.

Figure 4:
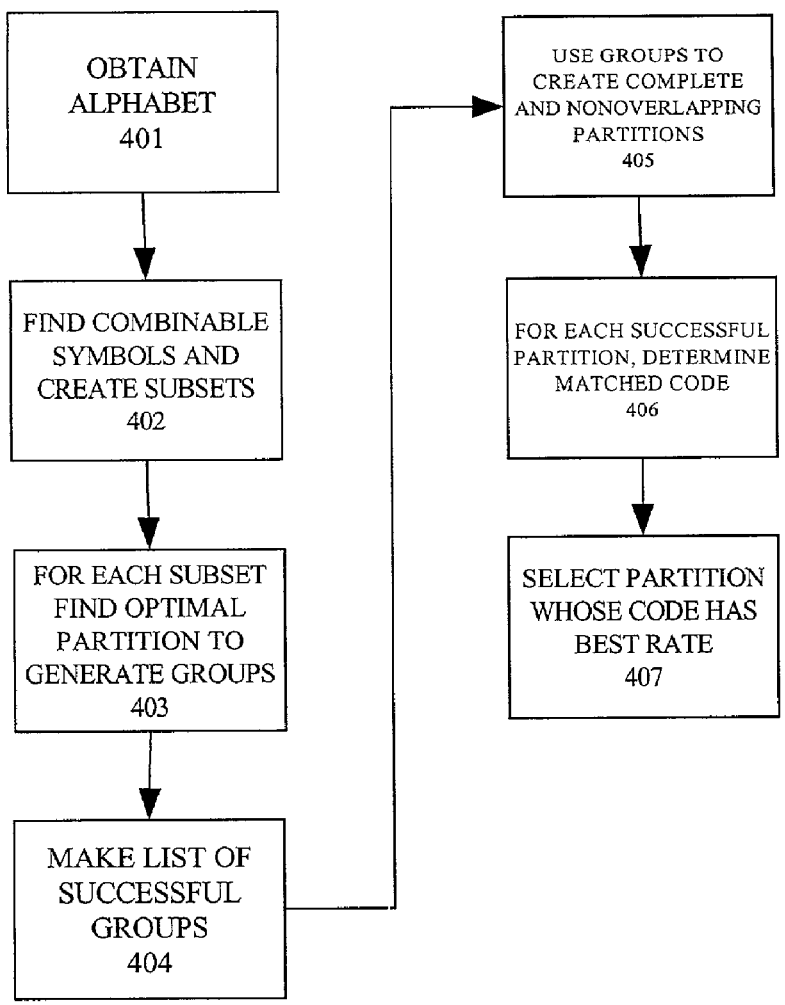
FIG. 4 is a flow diagram of an embodiment of the present invention.

FIG. 4 is a flow diagram that describes one embodiment of the invention. At step 401 the alphabet of symbols generated by the sources is obtained. These symbols are organized into combinable subsets of symbols at step 402. These subsets are such that there is no ambiguity between subsets as will be explained below. At step 403 the subsets are formed into optimal groups. These optimal groups are listed at step 404. The groups are used to find and define optimal partitions at step 405 that are complete and non-overlapping trees of symbols. The successful partitions are used to generate matched codes at step 406, using either arithmetic or Huffman codes. One skilled in the art will recognize that lossless codes other than Huffman and arithmetic can be utilized as well. At step 407, the partition whose matched code has the best rate is selected and used for the MASC solution.

Lossless Side-Information Coding

One embodiment of the present invention presents an implementation for lossless side-information source coding.

This problem is a special case of the general lossless MASC problem. (In a general MASC, the decoder has to decode both sources (i.e. X and Y) without knowing either one). By contrast, in the side-information application, one of data sources is known to the decoder. The goal is to find an optimal way to encode one of the data sources given the other source is known.

The invention will be described first in connection with a lossless, side-information MASC solution. Later we describe other embodiments of the invention for a lossless general MASC solution, and embodiments for near-lossless side-information and general MASC solutions.

Figure 9:
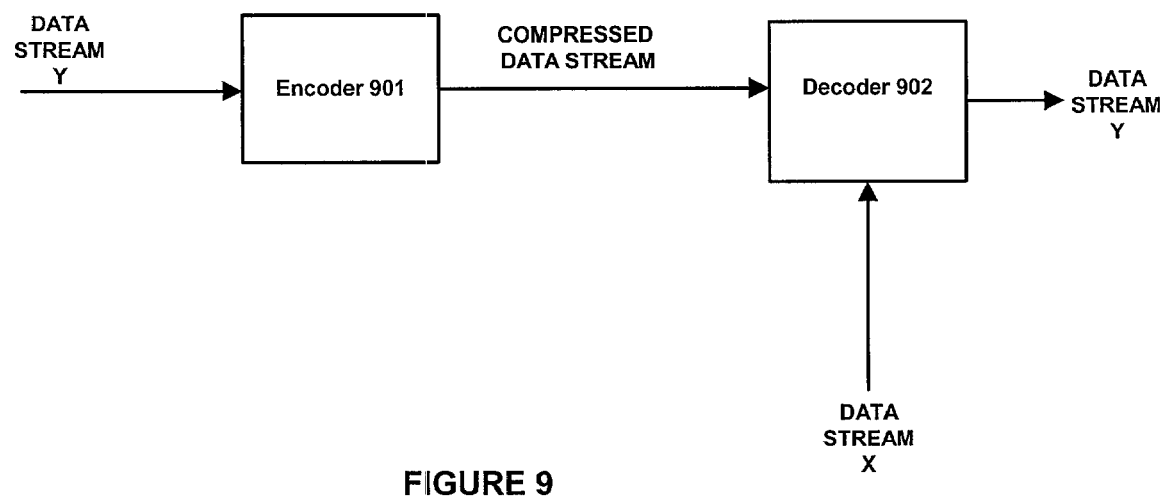
FIG. 9 is a block diagram of a side-information joint decoder embodiment of the invention.

FIG. 9 shows an example side-information multiple access network. Side-information X is perfectly known to the decoder 902 (or losslessly described using an independent code on x), and the aim is to describe Y efficiently using an encoder 901 that does not know X. This scenario describes MASCs where $\gamma X$ encodes X using a traditional code for p.m.f. $\{p(x)\}_{x \in X}$ and encoder $\gamma Y$ encodes Y assuming that the decoder decodes X before decoding Y. In this case, if the decoder 902 can correctly reconstruct $y_1$ by reading only the first $|\gamma_Y(Y_1)|$ bits of the description of the Y data stream $\gamma_Y(Y_1)\gamma_Y(Y_2)\gamma_Y(Y_3)\ldots$ from encoder 901 (without prior knowledge of these lengths), then the code $\gamma Y$ is a lossless instantaneous code for Y given X or a lossless instantaneous side-information code. Note that the side-information as shown in the figure comes from an external source to decoder 902. This external source can come from a wide variety of places. For example it is possible that the decoder already has embedded side information within it. Another example is that the external source is a data stream from another encoder similar to encoder 901.

A necessary and sufficient condition for $\gamma Y$ to be a lossless instantaneous code for Y given side information X is: for each $x \in X$, $y,y' \in A_x$ implies that $\gamma_Y(Y)$ and $\gamma_Y(Y')$ satisfy the prefix condition (that is, neither binary codeword is a prefix of the other codeword), where $A_x = \{y \in Y: p(x,y) > 0\}$.

It is important to note that instantaneous coding in a side-information MASC requires only that $\{\gamma_Y(Y):y \in A_x\}$ be prefix-free for each $x \in X$ and not that $\{\gamma_Y(Y):y \in Y\}$ be prefix-free, as would be required for instantaneous coding if no side-information were available to the decoder. This is because once the decoder knows X, it eliminates all $y' \notin A_x$ (since $y' \notin A_x$ implies $p(X,y')=0$). Since all codewords for $y \in A_x$ satisfy the prefix condition, the decoder can use its knowledge of X to instantaneously decode Y.

Thus the optimal code may violate the prefix condition either by giving identical descriptions to two symbols (having two y symbols be encoded by the same codeword: $\gamma_Y(Y)=\gamma_Y(Y')$ for some $y \neq y'$ or by giving one symbol a description that is a proper prefix of the description of some other symbols. We write $\gamma_Y(Y) \leq \gamma_Y(Y')$ if the description of y is a prefix of the description of y' where $y \neq y'$; and $\gamma_Y(Y) > \gamma_Y(Y')$ if $\gamma_Y(Y)$ is a proper prefix of $\gamma_Y(Y')$ meaning we disallow the case of $\gamma_Y(Y)=\gamma_Y(Y')$.

Invention Operation

We will illustrate the operation of the present invention with the data set of Table 3. Table 1 gives a sample joint probability distribution for sources X and Y, with alphabets $X=Y=\{a_0,a_1,\ldots,a_7\}$.

TABLE 3 p(x, y)

| | | | | y | | | | |
|---|---|---|---|---|---|---|---|---|
| x | $a_0$ | $a_1$ | $a_2$ | $a_3$ | $a_4$ | $a_5$ | $a_6$ | $a_7$ |
| $a_0$ | 0.04 | 0 | 0.15 | 0 | 0 | 0 | 0 | 0 |
| $a_1$ | 0 | 0.04 | 0 | 0.05 | 0.06 | 0 | 0 | 0 |
| $a_2$ | 0.04 | 0 | 0.05 | 0 | 0 | 0 | 0.01 | 0 |
| $a_3$ | 0.02 | 0 | 0 | 0.06 | 0 | 0.01 | 0 | 0 |
| $a_4$ | 0 | 0.05 | 0 | 0 | 0.05 | 0.02 | 0 | 0 |
| $a_5$ | 0 | 0.1 | 0 | 0 | 0 | 0.03 | 0.06 | 0 |
| $a_6$ | 0 | 0 | 0 | 0 | 0 | 0 | 0.02 | 0.05 |
| $a_7$ | 0 | 0 | 0 | 0 | 0 | 0 | 0.01 | 0.08 |

Combinable Symbols

Figure 5:
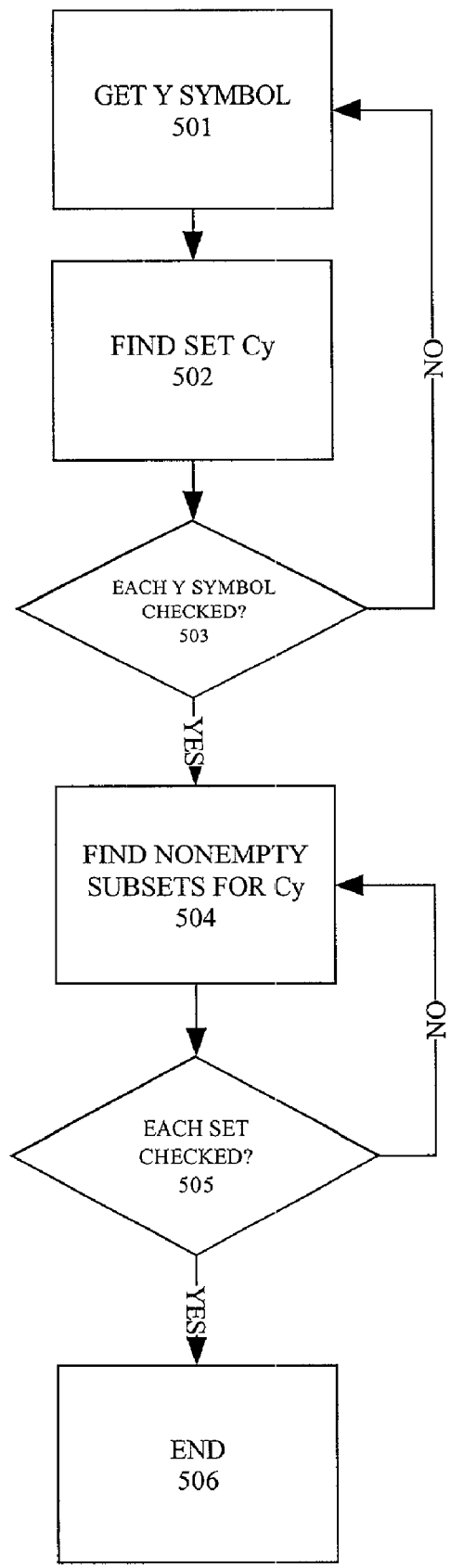
FIG. 5 is a flow diagram of an embodiment of finding combinable symbols of the present invention.

At step 402 of FIG. 4 we find combinable symbols and create subsets of these combinable symbols. FIG. 5 is a flow diagram that describes the operation of finding combinable symbols and creating subsets of step 402. This example is directed to finding the combinable symbols of Y data.

Symbols $y_1, y_2 \in Y$ can be combined under p(x,y) if $p(x,y_1)p(x,y_2)=0$ for each $x \in X$. At step 501 of FIG. 5, a symbol y is obtained and at step 502 we find the set $C_y = \{z \in Y: z$ can be combined with y under $p(x,y)\}$. Symbols in set $C_y$ can be combined with symbol y but do not need to be combinable with each other. For example, the set $C_y$ for $a_0$ is $\{a_1, a_4, a_7\}$ (note that $a_1$ and $a_4$ need not be combinable with each other).

In checking combinability, the first y symbol $a_0$ is examined and compared to symbols $a_1$-$a_7$. $a_0$ is combinable with $a_1$ because $p(x,a_0) \cdot p(x,a_1)=0 \forall x \in X$. However, $a_0$ is not combinable with $a_2$ because $p(x,a_0) \cdot p(x,a_2)>0$ for $x=a_0, x=a_2$. At step 503 it is determined if each y symbol has been checked and a set $C_y$ has been generated. If not, the system returns to step 501 and repeats for the next y symbol. If all y symbols have been checked at step 503, all of the sets $C_y$ have been generated. Using the example of Table 3, the generated sets $C_y$ for each symbol are shown below in Table 4.

TABLE 4

| | |
|---|---|
| $a_0$ | $a_1, a_4, a_7$ |
| $a_1$ | $a_0, a_2, a_7$ |
| $a_2$ | $a_1, a_3, a_4, a_5, a_7$ |
| $a_3$ | $a_2, a_6, a_7$ |
| $a_4$ | $a_0, a_2, a_6, a_7$ |
| $a_5$ | $a_2, a_7$ |
| $a_6$ | $a_3, a_4$ |
| $a_7$ | $a_0, a_1, a_2, a_3, a_4, a_5$ |

Continuing with FIG. 5, at step 504 we find the nonempty subsets for each set $c_y$. For example, the non empty subsets for set $c_y$ of symbol $a_0$ are $\{a_1\}, \{a_4\}, \{a_7\}, \{a_1, a_4\}, \{a_1, a_7\}, \{a_4, a_7\}$, and $\{a_4, a_4, a_7\}$. At step 505 it is determined if each set $C_y$ has been checked. If not, the system checks the next set $C_y$ at step 504. If all sets $C_y$ have been checked, the process ends at step 506.

Groups

We call symbols $y,y' \in Y$ "combinable" if there exists a lossless instantaneous side-information code in which $\gamma_Y(Y) \leq \gamma_Y(Y')$. If we wish to design a code with $\gamma_Y(Y)=\gamma_Y(Y')$, then we join those symbols together in a "1-level group." If we wish to give one 1-level group a binary description that is a proper prefix of the binary description of other 1-level groups, then we build a "2-level group." These ideas generalize to M-level groups with M>2.

Figure 6:
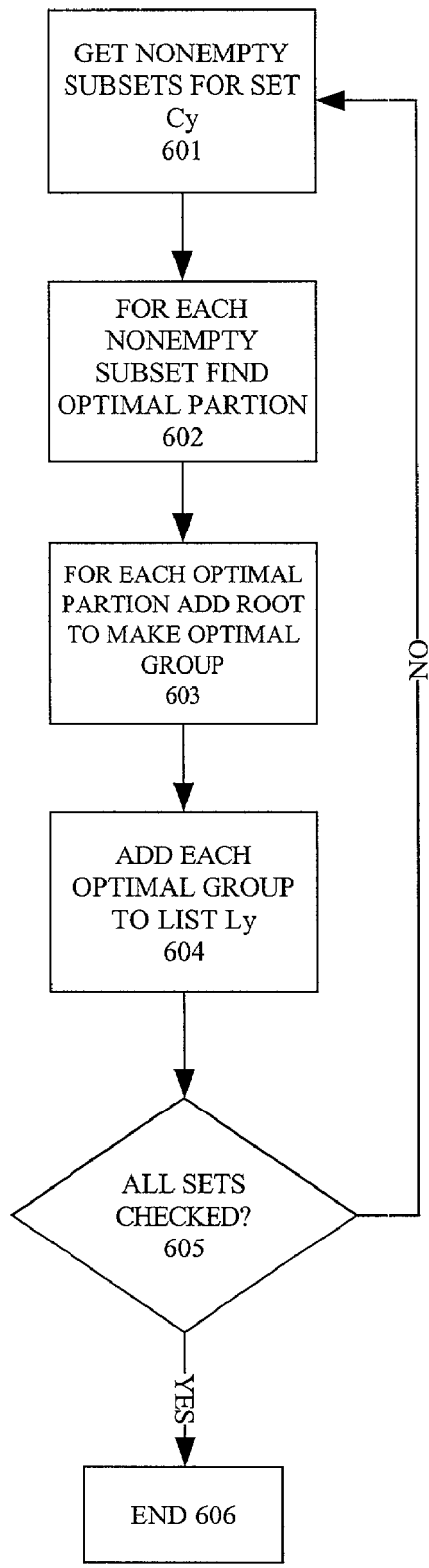
FIG. 6 is a flow diagram of an embodiment for building a list of groups.

FIG. 6 is a flow diagram of the group generation 403 and list making steps 404 of FIG. 4. At step 601 the nonempty subsets for a set $C_y$ generated by step 402 of FIG. 4 are obtained. At step 602 the optimal partition is found for each nonempty subset. At step 603 a root is added to the optimal partition to create an optimal group. For example, for an optimal partition of a subset of the set $C_y$ of $a_0$, $a_0$ is added as the root of this optimal partition. This optimal group is added to a list $L_y$ at step 604. At step 605 it is determined if all sets have been checked. If not, the system returns to step 601 and gets the nonempty subsets of the next set. If so, the process ends at step 606. After the operation of the steps of FIG. 6, we have a list, $L_y$ that contains optimal groups.

The mathematical and algorithmical representations of the flow diagrams of FIGS. 4, 5, and 6 are presented here. Symbols $y_1$, $y_2 \in Y$ can be combined under p(x,y) if $p(x,y_1)$ $p(x,y_2)=0$ for each $x \in X$. The collection $G=(y_1, \ldots, y_m)$ is called a 1-level group for p(x,y) if each pair of distinct members $y_i, y_j \in G$ can be combined under p(x,y). For any $y \in Y$ and any p(x,y), (y) is a special case of a 1-level group. The tree representation T(G) for 1-level group g is a single node representing all members of g.

A 2-level group for p(x,y) denoted by G=(R:C(R)) comprises a root R and its children C(R), where R is a 1-level group, C(R) is a set of 1-level groups, and for each $G' \in C(R)$, each pair $y_1 \in R$ and $y_2 \in G'$ can be combined under p(x,y). Here members of all $G' \in C(R)$ are called members of C(R), and members of R and C(R) are called members of G. In the tree representation T(G) for G, T(R) is the root of T(G) and the parent of all subtrees T(G') for $G' \in C(R)$.

This ideas generalize to M-level groups. For each subsequent M>2, an M-level group for p(x,y) is a pair G=(R:C(R)) such that for each G'531 C(R), each pair $y_1 \in R$ and $y_2 \in G'$ can be combined under p(x,y). Here R is a 1-level group and C(R) is a set of groups of M−1 or fewer levels, at least one of which is an (M−1)-level group. The members of R and C(R) together comprise the members of G=(R:C(R)). Again, T(R) is the root of T(G') and the parent of all subtrees T(G') for $G' \in C(R)$. For any M>1, an M-level group is also called a multi-level group.

We use the probability mass function (p.m.f.) in Table 1, with $X=Y=\{a_0, a_1, \ldots, a_6, a_7\}$, to illustrate these concepts. For this p.m.f., $(a_0, a_4, a_7)$ is one example of a 1-level group since $p(x,a_0)p(x,a_4)=0, p(x,a_0)p(x,a_7)=0$ and $p(x,a_4)p(x,a_7)=0$ for all $x \in X$. (This is seen in Table 2 as the entries for $a_0$). The pair $(a_4, a_7)$, a subset of $(a_0, a_4, a_7)$, is a distinct 1-level group for p(x,y). The tree representation for any 1-level group is a single node.

An example of a 2-level group for p(x,y) is $G_2=((a_4):\{(a_0), (a_2, a_7), (a_6)\})$. In this case the root node $R=(a_4)$ and $C(R)=\{(a_0), (a_2,a_7), (a_6)\}$. The members of C(R) are $\{a_0, a_2, a_6, a_7\}$; the members of $G_2$ are $\{a_0, a_2, a_4, a_6, a_7\}$. Here $G_2$ is a 2-level group since symbol $a_4$ can be combined with each of $a_0, a_2, a_6, a_7$ and $(a_0), (a_2, a_7), (a_6)$ are 1-level groups under p.m.f. p(x,y). The tree representation $T(G_2)$ is a 2-level tree. The tree root has three children, each of which is a single node.

An example of a 3-level group for p(x,y) is $G_3=((a_7): \{(a_0), a_1), ((a_2):\{(a_4), (a_5)\})\})$. In $T(G_3)$, the root $T(G_7)$ of the three-level group has three children: the first two children are nodes $T(G_0)$ and $T(G_1)$; the third child is a 2-level tree with root node $T(a_2)$ and children $T(a_4)$ and $T(a_5)$. The tree representation $T(G_3)$ is a 3-level tree.

Optimal Groups

The partition design procedure for groups is recursive, solving for optimal partitions on sub-alphabets in the solution of the optimal partition on Y. For any alphabet $Y' \subseteq Y$, the procedure begins by making a list $L_{y'}$ of all (single- or multi-level) groups that can appear in an optimal partition P(Y') of Y' for p(x,y). The list is initialized as $L_{y'}=\{(y): y \in Y'\}$. For each symbol $y \in Y'$, we wish to add to the list all groups that have y as one member of the root, and some subset of Y' as members. To do that, we find the set $C_y=\{z \in Y': z$ can be combined with y under $p(x,y)\}$. For each non-empty subset $S \subseteq C_y$ such that $L_{y'}$ does not yet contain a group with elements $S \cup \{y\}$, we find the optimal partition P(S) of S for p(x,y) We construct a new multi-level group G with elements $S \cup \{y\}$ by adding y to the empty root of T(P(S)) if P(S) contains more than one group or to the root of the single group in P(S) otherwise. Notice that y can be the prefix of any symbol in S. Since y can be combined with all members of $S \cup \{y\}$, y must reside at the root of the optimal partition of $S \cup \{y\}$; thus G is optimal not only among all groups in {G':members of G' are $S \cup \{y\}$ and y is at the root of G} but among all groups in {G':members of G' are $S \cup \{y\}$}. Group G is added to the $L_{y'}$, and the process continues.

After this is accomplished, the list of optimal groups (step 404 of FIG. 4) has been accomplished.

Optimal Partitions Design

Figure 7:
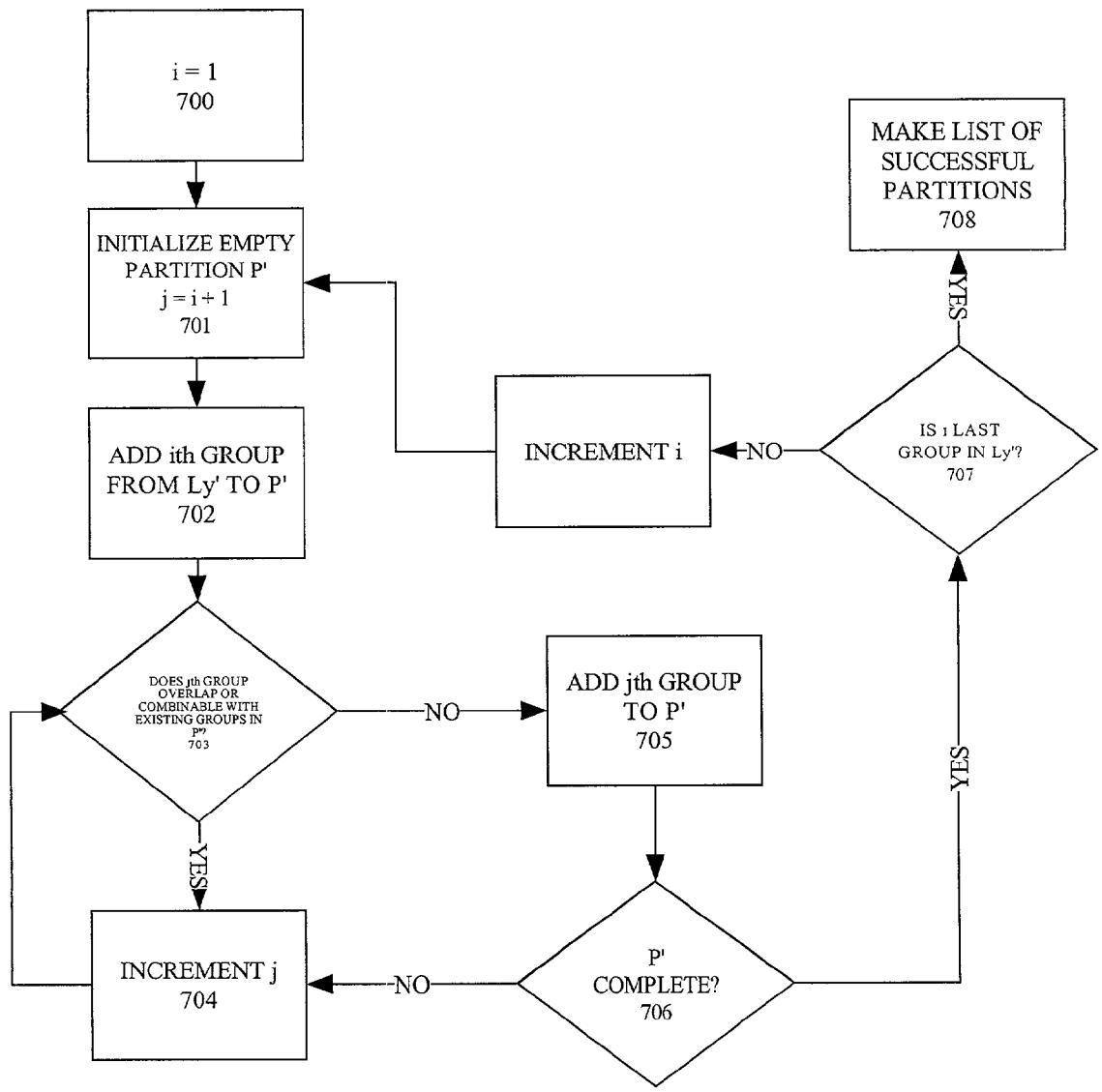
FIG. 7 is a flow diagram for constructing optimal partitions.

After the list of optimal groups has been created, it is used to create optimal (complete and non-overlapping) partitions. (A more thorough partition definition will be introduced in a later section titled "Optimal Partition: Definition and Properties.") Complete and non-overlapping means that all symbols are included but none are included more than once. Referring to FIG. 7, the steps for accomplishing this are shown. At step 700 we initialize i equal to 1. At step 701 we initialize an empty partition P', j=i+1. At step 702 we add the "i th" group from $L_{y'}$ to P'. At step 703 we check to see if the jth group overlaps or is combinable with existing groups in P'. If so, we increment j and return to step 703. If not, the jth group is added to P' at step 705. At step 706 we check to see if P' is complete. If not, increment j at step 704 and return to step 703. If P' is complete then see if i is the last group in $L_{y'}$ at step 707. If so, make a list of successful partitions at step 708. If not, then increment i and return to step 701.

The operations of FIG. 7 are performed mathematically as follows. A partition P(Y) on Y for p.m.f. p(x,y) is a complete and non-overlapping set of groups. That is, $P(Y)=\{G_1, G_2, \ldots, G_m\}$ satisfies $$\bigcup_{i=1}^{m} G_i = y$$

and $G_j \cap G_k = \phi$ for any $j \neq k$, where each $G_i \in P(Y)$ is a group for p(x,y), and $G_j \cup G_k$ and $G_j \cap G_k$ refer to the union and intersection respectively of the members of $G_j$ and $G_k$. The tree representation of a partition is called a partition tree. The partition tree T(P(Y)) for partition $P(Y)=\{G_1, G_2, \ldots, G_m\}$ is built as follows: first, construct the tree representation for each $G_i$; then, link the root of all $T(G_i), i \in \{1, \ldots, m\}$ to a single node, which is defined as the root r of T(P(Y)). A partition tree is not necessarily a regular k-ary tree; the number of children at each node depends on the specific multi-level group.

After constructing the above list of groups, we recursively build the optimal partition of Y' for p(x,y). If any group $G \in L_{y'}$ contains all of the elements of Y', then $P(Y')=\{G\}$ is the optimal partition on Y'. Otherwise, the algorithm systematically builds a partition, adding one group at a time from $L_{y'}$ to set P(Y') until P(Y') is a complete partition. For G∈$L_{y'}$ to be added to P(Y'), it must satisfy: (1) G∩G'=∅; and (2) G, G' cannot be combined (see Theorem 4 for arithmetic or Theorem 5 for Huffman coding) for all G'∈P(Y').

Figure 10A:
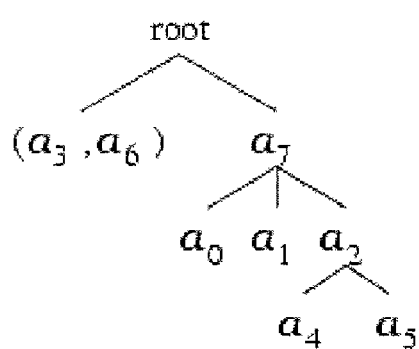
FIGS. 10A–10D illustrate node labeling and coding using the present invention.

FIG. 10A gives an example of a partition tree from the example of Table 1. In this case the partition P(Y)={($a_3,a_6$), $G_3$}. This indicates that the root node has two children, one is a1-level group T($a_3,a_6$) and the other is a 3-level group consisting of root node T($a_7$), with children T($a_0$), T($a_1$) and T($a_2$), T($a_2$) is the root for its children T($a_4$) and T($a_5$)

As a prelude to generating matched code for optimal partitions, the branches of a partition are labeled. We label the branches of a partition tree as follows. For any 1-level group g at depth d in T(P(Y)), let n describe the d-step path from root r to node T(G) in T(P(Y)). We refer to g by describing this path. Thus T(n)=T(G). For notational simplicity, we sometimes substitute n for T(n) when it is clear from the context that we are talking about the node rather than the 1-level group at that node (e.g. n∈T(P(Y))) rather than T(n)∈T(P(Y)). To make the path descriptions unique, we fix an order on the descendants of each node and number them from left to right. Thus n's children are labeled as n1, n2, . . . , nK(n), where nk is a vector created by concatenating k to n and K(n) is the number of children descending from n. The labeled partition tree for FIG. 10A appears in FIG. 10B.

Figure 10B:
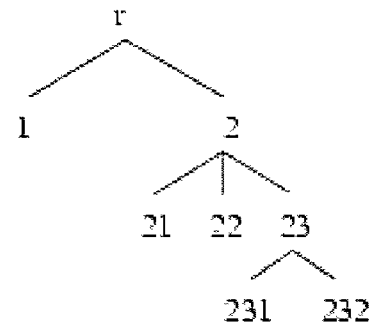

The node probability q(n) of a 1-level group n with n∈T(P(Y)) is the sum of the probabilities of that group's members. The subtree probability Q(n) of the 1-level group at node n∈T(P(Y)) is the sum of probabilities of n's members and descendants. In FIG. 10B, q(23)=$P_Y(a_2)$ and Q(23)= $P_Y(a_2)$+$P_Y(a_4)$+$P_Y(a_5)$.

Referring to FIG. 10B, the root node is labeled "r" and the first level below, comprising a pair of children nodes, is numbered "1" and "2" from left to right as per the convention described above. For the children of the root at number "2", the concatenation convention and left to right convention results in the three children nodes being labeled "21", "22", and "23" respectively. Accordingly, the children at root "23" are labeled "231" and "232".

Matched Code Generation

After creating partitions, the present invention determines the optimal partitions by generating matched code for each partition. The partition whose matched code has the best rate (of compression) is the partition to use for the MASC solution. These steps are described in FIG. 8.

Figure 8:
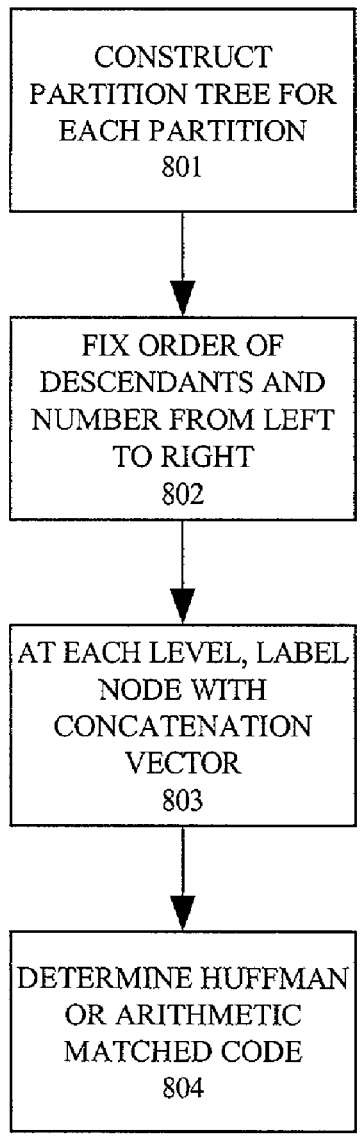
FIG. 8 is flow diagram of an embodiment for constructing a partition tree and labeling of each node within the tree.

Referring to FIG. 8, at step 801 a partition tree is constructed for each partition. (Note that this step is described above). At step 802 the order of descendants is fixed and numbered from left to right. At step 803, the node at each level is labeled with a concatenation vector. Thus n's children are labeled as n1, n2, . . . , nK(n), where nk is a vector created by concatenating k to n and K(n) is the number of children descending from n. The labeled partition tree for FIG. 10A appears in FIG. 10B. At step 804 a matched code is generated for the partition. This matched code can be generated, for example, by Huffman coding or Arithmetic coding.

Figure 17:
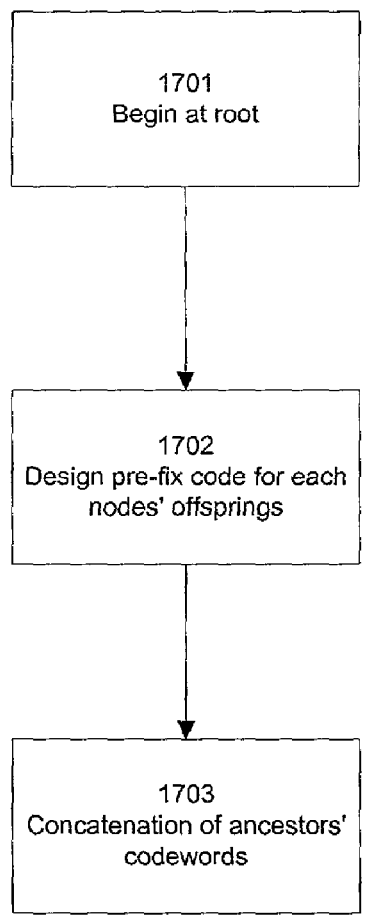
FIG. 17 is a flow diagram for generating matched code according to an embodiment of the present invention.

A matched code for a partition is defined as follows. A matched code γY for partition P(Y) is a binary code such that for any node n∈T(P(Y)) and symbols $y_1$, $y_2$∈n and $y_3$∈nk, k∈{1, . . . , K(n)}: (1) $\gamma_Y(Y_1)$=$\gamma_Y(Y_2)$; (2) $\gamma_Y(Y_1)$≻$\gamma_Y(Y_3)$; (3) {$\gamma_Y$(nk):k∈{1, . . . , K(n)}} is prefix-free. We here focus on codes with a binary channel alphabet {0,1}. The extension to codes with other finite channel alphabets is straight forward and the present invention is not limited to a binary channel alphabet. (We use $\gamma_Y$(n) interchangeably with $\gamma_Y$(Y) for any y∈n.) If symbol y∈Y belongs to 1-level group g, then $\gamma_Y$(Y) describes the path in T(P(Y)) from r to T(G); the path description is a concatenated list of step descriptions, where the step from n to nk, k∈{1, . . . , K(n)} is described using a prefix-code on {1, . . . , K(n)}. An example of a matched code for the partition of FIG. 10A appears in FIG. 10C, where the codeword for each node is indicated in parentheses. FIG. 17 shows how a matched code is generated according to one embodiment of the invention. In step 1701, the process begins at the root of the tree. Then at 1702, the prefix code for each nodes' offsprings are designed. Finally at 1703 the ancestors' codewords are concatenated to form the resulting matched code.

In the above framework, a partition specifies the prefix and equivalence relationships in the binary descriptions of y∈Y. A matched code is any code with those properties. The above definitions enforce the condition that for any matched code, $y_1$, $y_2$∈$A_x$ for some x∈X implies that $\gamma_Y(Y_1)$⊆$\gamma_Y(Y_2)$; that is, γY violates the prefix property only when knowing X eliminates all possible ambiguity.

Theorem 1 establishes the equivalence of matched codes and lossless side-information codes.

Theorem 1 Code γY is a lossless instantaneous side-information code for p(x,y) if and only if γY is a matched code for some partition P(Y) for p(x,y).

Proof: First we prove that a matched code for partition P(Y) is a lossless instantaneous side-information code for Y. This proof follows from the definition of a matched code. In a matched code for partition P(Y), only symbols that can be combined can be assigned codewords that violate the prefix condition, thus only symbols that can be combined are indistinguishable using the matched code description. Since symbols $y_1$ and $y_2$ can be combined only if p(x,$y_1$)p(x,$y_2$)=0 for all x∈X, then for each x∈X, the matched code's codewords for $A_x$={y∈Y:p(x,y)>0} is prefix free. Thus the decoder can decode the value of X and then losslessly decode the value of Y using the instantaneous code on $A_x$.

Next we prove that a lossless instantaneous side-information code γY must be a matched code for some partition P(Y) on y for p(x,y). That is given γY, it is always possible to find a partition P(Y) on Y for p(x,y), such that N={$\gamma_Y$(Y):y∈Y} describes a matched code for P(Y).

Begin by building a binary tree $T_2$ corresponding to N as follows. Initialize $T_2$ as a fixed-depth binary tree with depth max $\max_{y\in Y}|\gamma_Y(Y)|$. For each y∈Y, label the tree node reached by following path $\gamma_Y$(Y) downward from the root of the tree (here '0' and '1' correspond to left and right branches respectively in the binary tree). Call a node in $T_2$ empty if it does not represent any codeword in N and it is not the root of $T_2$; all other nodes are non-empty. When it is clear from the context, the description of a codeword is used interchangeably with the description of the non-empty node representing it.

Build partition tree T from binary tree $T_2$ by removing all empty nodes except for the root as follows. First, prune from the tree all empty nodes that have no non-empty descendants. Then, working from the leaves to the root, remove all empty nodes except for the root by attaching the children of each such node directly to the parent of that node. The root is left unchanged. In T:

(1) All symbols that are represented by the same codeword in N reside at the same node of T. Since γY is a lossless instantaneous side-information code, any $y_1$, $y_2$ at the same node in T can be combined under p(x,y). Hence each non-root node in T represents a 1-level group.

(2) The binary description of any internal node n∈T is the prefix of the descriptions of its descendants. Thus for γY to be prefix free on $A_x$ for each x∈X, it must be possible to combine n with any of its descendants to ensure lossless decoding. Thus n and its descendants form a multi-level group, whose root R is the 1-level group represented by n. In this case, C(R) is the set of (possibly multi-level) groups descending from n in T.

(3) The set of codewords descending from the same node satisfies the prefix condition. Thus T is a partition tree for some partition P(Y) for p(x,y) and N is a matched code for P(Y). □

Given an arbitrary partition P(Y) for p(x,y), we wish to design the optimal matched code for P(Y). In traditional lossless coding, the optimal description lengths are $l^*(y)=-\log p(y)$ for all y∈Y if those lengths are all integers. Theorem 2 gives the corresponding result for lossless side-information codes on a fixed partition P(Y).

Theorem 2 Given partition P(Y) for p(x,y), the optimal matched code for P(Y) has description lengths $l_{P(Y)}^*(r)=0$ and $$l_{P(\gamma)}^*(nk) = l_{P(\gamma)}^*(n) - \log_2\left(\frac{Q(nk)}{\sum_{j=1}^{K(n)} Q(nj)}\right)$$

for all n∈T(P(Y)) and k∈{1,...,K(n)} if those lengths are all integers. Here $l_{P(Y)}^*(n)=1$ implies $l_{P(Y)}^*(y)=1$ for all symbols y∈Y that are in 1-level group n.

Proof: For each internal node n∈T(P(Y)), the codewords $\{\gamma_Y(nk):k\in\{1,\ldots,K(n)\}\}$ share a common prefix and satisfy the prefix condition. Deleting the common prefix from each codeword in $\{\gamma_Y(nk):k=1,\ldots,K(n)\}$ yields a collection of codeword suffixes that also satisfy the prefix condition. Thus if $l_{P(Y)}(n)$ is the description length for n, then the collection of lengths $\{l_{P(Y)}(nk)-l_{P(Y)}(n): k=1,\ldots,K(n)\}$ satisfies the Kraft Inequality:

$$\Sigma_{k=1}^{K(n)} 2^{-(l_{P(Y)}(nk)-l_{P(Y)}(n))} \leq 1.$$

(Here $l_{P(Y)}(r)=0$ by definition.) We wish to minimize the expected length $$\bar{l}(\mathcal{P}(\gamma)) = \sum_{n\in\mathcal{T}(\mathcal{P}(\gamma))} q(n) l_{\mathcal{P}(\gamma)}(n),$$

of the matched code over all $l_{P(Y)}(n)$ that satisfy $$\sum_{k=1}^{K(n)} 2^{-(l_{\mathcal{P}(\gamma)}(nk)-l_{\mathcal{P}(\gamma)}(n))}=1,$$

$$\forall n \in I(P(Y))=\{n\in T(P(Y)):K(n)>0\}.$$

(We here neglect the integer constraint on code lengths.) If $$u(n)=2^{-l_{P(Y)}(n)},$$

then $$\bar{l}(\mathcal{P}(\gamma)) = \sum_{n\in\mathcal{T}(\mathcal{P}(\gamma))} q(n)\log\frac{1}{u(n)},$$

and u(n) must satisfy $$\sum_{k=1}^{k(n)} u(nk) = u(n), \forall n \in I(\mathcal{P}(\gamma)).$$

Since $\bar{l}(P(Y))$ is a convex function of u(n), the constrained minimization can be posed as an unconstrained minimization using the Lagrangian $$J = \sum_{n\in\mathcal{T}(\mathcal{P}(\gamma))} -q(n)\log u(n) + \sum_{n\in\mathcal{I}(\mathcal{P}(\gamma))} \lambda(n)\left(u(n) - \sum_{k=1}^{K(n)} u(nk)\right)$$

Differentiating with respect to u(n) and setting the derivative to 0, we get $$\begin{cases} -q(nk)/u(nk)\log e + \lambda(nk) - \lambda(n) = 0, & \text{if } nk \text{ is an internal node;} \\ -q(nk)/u(nk)\log e - \lambda(n) = 0. & \text{if } nk \text{ is a leaf node.} \end{cases} \quad (1)$$

First consider all nk's at the lowest level of the tree that have the same parent n. We have $$\begin{cases} q(nk)/u(nk)\log e = Q(nk)/u(nk)\log e = -\lambda(n), & k = 1,\ldots,K(n); \\ \sum_{k=1}^{K(n)} u(nk) = u(n) \end{cases} \quad (2)$$

Thus we get $$u(nk) = q(nk)\frac{u(n)}{\sum_{j=1}^{K(n)} q(nj)} = q(nk)\frac{u(n)}{\sum_{j=1}^{K(n)} Q(nj)} \quad \forall k = 1,\ldots,K(n) \quad (3)$$

giving $$\lambda(n) = -\frac{\sum_{j=1}^{K(n)} Q(nj)}{u(n)}\log e.$$

Other nodes at the lowest level are processed in the same way.

Now fix some $n_1$ two levels up from the tree bottom, and consider any node $n_1 k$.

Case 1: If $n_1 k$ has children that are at the lowest level of the tree, then by (1), $$-\frac{q(n_1 k)}{u(n_1 k)}\log e + \lambda(n_1 k) - \lambda(n_1) = 0. \quad (4)$$

Substituting (3) into (4) gives $$-\frac{q(n_1k)}{u(n_1k)}\log e - \frac{\sum_{j=1}^{K(n_1k)} Q(n_1kj)}{u(n_1k)}\log e - \lambda(n_1) = \qquad (5)$$

$$-\frac{Q(n_1k)}{u(n_1k)}\log e - \lambda(n_1) = 0,$$

that is $$\frac{Q(n_1k)}{u(n_1k)}\log e = -\lambda(n_1) \qquad (6)$$

Case 2: If $n = n_1k$ has no children, then by (1), $$\frac{q(n_1k)}{u(n_1k)}\log e = \frac{Q(n_1k)}{u(n_1k)}\log e = -\lambda(n_1),$$

which is the same as (6).

Considering all such $n_1k$, $k=1, \ldots, K(n_1)$ we have $$\begin{cases} Q(n_1k)/u(n_1k)\log e = -\lambda(n_1), & k = 1, \ldots, K(n_1) \\ \sum_{k=1}^{K(n_1)} u(n_1k) = u(n_1) \end{cases} \qquad (7)$$

which is the same problem as (2) and is solved in the same manner.

Continuing in this way (from the bottom to the top of $T(P(Y))$), we finally obtain $$u(nk) = \frac{Q(nk)}{\sum_{j=1}^{K(n)} Q(nj)} u(n), \forall k = 1, \ldots, K(n) \forall n \in I(\mathcal{P}(y)). \qquad (8)$$

Setting $l_{P(Y)}^{\star}(nk) = -\log u(nk)$ completes the proof. □

Figure 18:
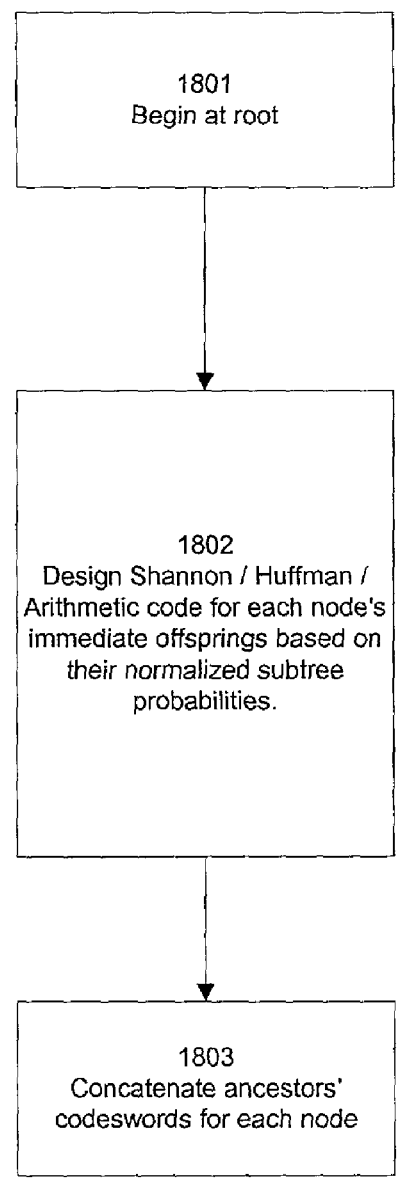
FIG. 18 is a flow diagram for building matched codes that approximate the optimal length function according to another embodiment of the present invention.

Thus, Theorem 2 provides a method of calculating the optimal length function. We now present three strategies for building matched codes that approximate the optimal length function of Theorem 2. FIG. 18 shows the process of building matched codes. At step 1801 the process begins at root. Then at 1802 one of three strategies is used (Shannon/Huffman/Arithmetic code) for code design for each node's immediate offsprings based on their normalized subtree probabilities. At 1803 the ancestors' codewords for each node are concatenated.

For any node n with $K(n)>0$, the first matched code $\gamma^{Y,P(Y)(S)}$ describes the step from n to nk using a Shannon code with alphabet $\{1, \ldots, K(n)\}$ and p.m.f.

$$\{Q(nk)/\Sigma_{j=1}^{K(n)}Q(nj)\}_{k=1}^{K(n)};$$

the resulting description lengths are $$l_{P(Y)}^{(S)}(r) = 0$$

and $$l_{P(Y)}^{(S)}(nk) = l_{P(Y)}^{(S)}(n) + \lceil \log_2(\Sigma_{j=1}^{K(n)}Q(nj)/(Q(nk)) \rceil.$$

Codes $\gamma_{Y,P(Y)}^{(H)}$ and $\gamma_{Y,P(Y)}^{(A)}$, replace the Shannon codes of $\gamma_{Y,P(Y)}^{(S)}$ with Huffman and arithmetic codes, respectively, matched to the same p.m.f.s.

Matched Huffman Coding

Figure 10C:
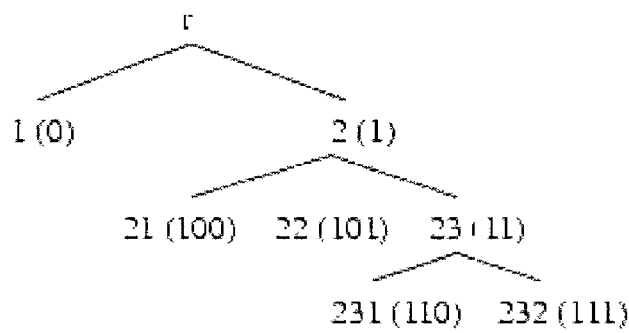
Figure 11:
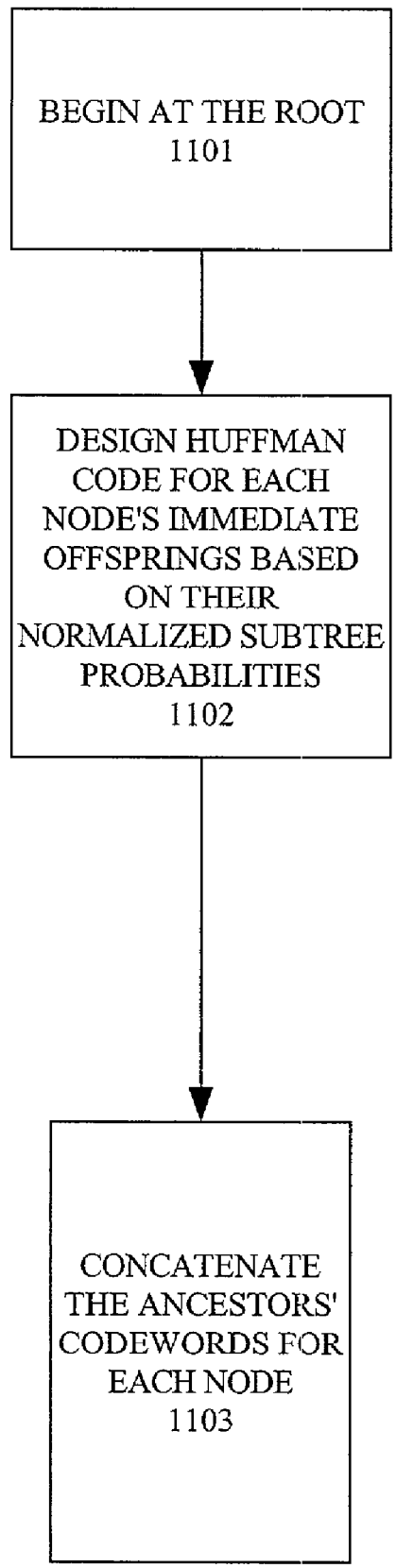
FIG. 11 is a flow diagram illustrating Huffman code word generation using the present invention.

As an example, build the matched Huffman code for the partition in FIG. 10A, working from the top to the bottom of the partition tree T. A flow diagram illustrating the steps of this process is illustrated in FIG. 11. At step 1101 we begin at the root node and we design a Huffman code on the set of nodes descending from T's root, according to their subtree probabilities, i.e. nodes $\{(a_3, a_6), (a_7)\}$ with p.m.f.

$$\{p_Y(a_3)+p_Y(a_6)p_Y(a_7)+p_Y(a_0)+p_Y(a_1)+p_Y(a_2)+p_Y(a_4)+p_Y(a_5)\}=\{0.21, 0.79\};$$

a Huffman code for these two branches is $\{0,1\}$. Referring to FIG. 10C we see the calculated codes for the two nodes below the root node (given in parentheses) is 0 and 1.

At step 1102, for each subsequent tree node n with $K(n)>0$, consider $\{nk\}_{k=1}^{K(n)}$ as a new set, and do Huffman code design on this set, with p.m.f $$\{Q(nk)/\Sigma_{j=1}^{K(n)}Q(nj)\}_{k=1}^{K(n)}.$$

We first design a Huffman code for group $(a_7)$'s children $\{(a_0), (a_2), (a_2)\}$ according to p.m.f.

$$\{p_Y(a_0)/Q, p_Y(a_1)/Q, p_Y(a_2)+p_Y(a_4)+p_Y(a_5)/Q\} = \{0.1/Q, 0.19/Q, 0.37/Q\}$$

where $$Q = p_Y(a_0)+p_Y(a_1)+p_Y(a_2)+p_Y(a_4)+p_Y(a_5)=0.66;$$

a Huffman code for this set of branches is $$\{00, 01, 1\}.$$

Then we design Huffman code $\{0, 1\}$ for groups $\{(a_4), (a_5)\}$ with p.m.f.

$$\{p_Y(a_4)/p_Y(a_4)+p_Y(a_5)), p_Y(a_5)/(p_Y(a_4)+p_Y(a_5))\} = \{0.11/0.17, 0.06/0.17\}.$$

The full codeword for any node n is the concatenation of the codewords of all nodes traversed in moving from root $T(r)$ to node n in T. The codewords for this example are shown in FIG. 10C.

Any "matched Huffman code" $\gamma_{Y,P(Y)}^{(H)}$ is shown to be optimal by Theorem 3.

Theorem 3 Given a partition $P(Y)$, a matched Huffman code for $P(Y)$ achieves the optimal expected rate over all matched codes for $P(Y)$.

Proof: Let T be the partition tree of $P(Y)$. The codelength of a node $n \in T$ is denoted by $l(n)$.

The average length $\bar{l}$ for $P(Y)$ is $$\bar{l} = \sum_{n \in T} q(n)l(n) = \sum_{k=1}^{K(r)} (Q(k)l(k) + \Delta \bar{l}(k)),$$

where for each $$k \in \{1, \ldots, K(r)\},$$

$$\Delta \bar{l}(k) = \Sigma_{kn \in T} q(kn)(l(kn) - l(k)).$$

Note that $\sum_{k=1}^{K(r)} Q(k)l(k)$ and $\{\Delta \bar{l}(k)\}$ can be minimized independently. Thus $$\min \bar{l} = \min \sum_{k=1}^{K(r)} Q(k)l(k) + \sum_{k=1}^{K(r)} \min \Delta \bar{l}(k).$$

In matched Huffman coding, working from the top to the bottom of the partition tree, we first minimize $\sum_{k=1}^{K(r)} Q(k) l(k)$ over all integer lengths $l(k)$ by employing Huffman codes on $Q(k)$. We then minimize each $\Delta \bar{l}(k)$ over all integer length codes by similarly breaking each down layer by layer and minimizing the expected length at each layer. □

Matched Arithmetic Coding

In traditional arithmetic coding (with no side-information), the description length of data sequence $y^n$ is $l(y^n) = \lceil -\log p_Y(y^n) \rceil + 1$ where $p_Y(Y^n)$ is the probability of $y^n$. In designing the matched arithmetic code of $y^n$ for a given partition $P(Y)$, we use the decoder's knowledge of $x^n$ to decrease the description length of $y^n$. The following example, illustrated in FIGS. 12B–12C, demonstrates the techniques of matched arithmetic coding for the partition given in FIG. 10A.

Figures 12A, 12B, 12C:
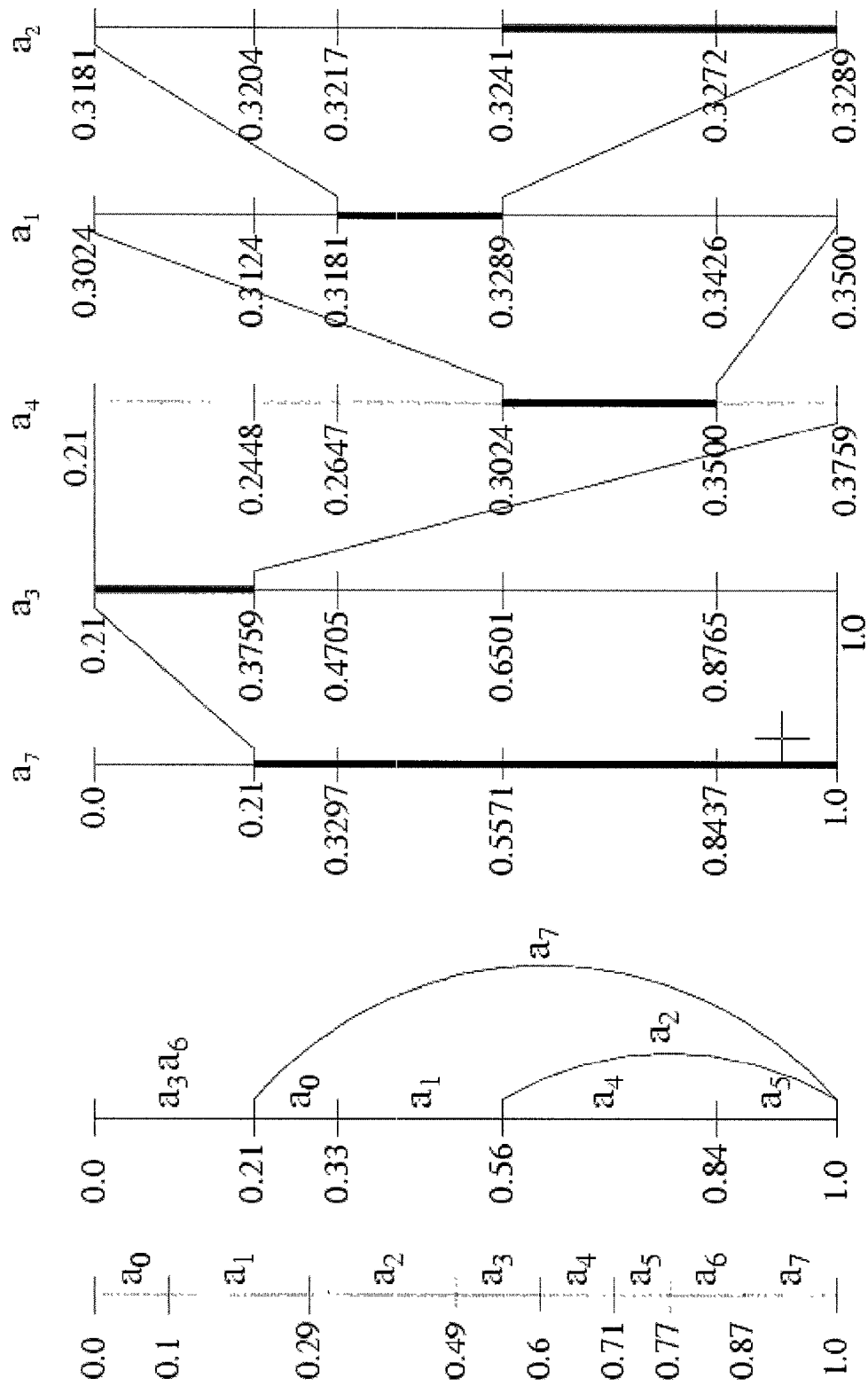
FIGS. 12A–12C illustrate arithmetic coding using the present invention.

In traditional arithmetic coding as shown in FIG. 12A, data sequence $Y^n$ is represented by an interval of the $[0, 1)$ line. We describe $Y^n$ by describing the mid-point of the corresponding interval to sufficient accuracy to avoid confusion with neighboring intervals. We find the interval for $y^n$ recursively, by first breaking $[0, 1)$ into intervals corresponding to all possible values of $y_1$, then breaking the interval for the observed $Y_1$ into subintervals corresponding to all possible values of $Y_{1,2}$, and so on. Given the interval $A \subseteq [0, 1]$ for $Y^k$ for some $0 \leq k < n$ (the interval for $Y^0$ is $[0, 1)$), the subintervals for $\{Y_{kY_{k+1}}\}$ are ordered subintervals of $A$ with lengths proportional to $p(y_{k+1})$.

In matched arithmetic coding for partition $P(Y)$ as shown in FIG. 12B, we again describe $Y^n$ by describing the midpoint of a recursively constructed subinterval of $[0, 1)$. In this case, however, if $Y_1 \in n_0$ at depth $d(n_0) = d_0$ in $T(P(Y))$, we break $[0, 1)$ into intervals corresponding to nodes in $B = \{n:(K(n)=0 \land d(n) \leq d_0) \lor (K(n)>0 \land d(n)=d_0)\}$. The interval for each $n \in B$ with parent $n_0$ has length proportional to $$p^{(A)}(n) = p^{(A)}(n_0)\left(\frac{Q(n)}{\sum_{k=1}^{K(n_0)} Q(n_0 k)}\right) = p^{(A)}(n_0)\left(\frac{Q(n)}{Q(n_0) - q(n_0)}\right)$$

(here $p^{(A)}(n)$ is defined to equal 1 for the unique node $r$ at depth 0). Refining the interval for sequence $Y^{i-1}$ to find the subinterval for $Y^i$ involves finding the 1-level group $n \in P(Y)$ such that $Y_i \in n$ and using $d(n)$ to calculate the appropriate $p^{(A)}$ values and break the current interval accordingly. We finally describe $Y^n$ by describing the center of its corresponding subinterval to an accuracy sufficient to distinguish it from its neighboring subintervals. To ensure unique decodability, $l^{(A)}(y^n) = \lceil -\log p^{(A)}(y^n) \rceil + 1$, where $p^{(A)}(y^n)$ is the length of the subinterval corresponding to string $y^n$. Given a fixed partition $P(Y)$, for each $y \in Y$ denote the node where symbol $y \in Y$ resides by $n(y)$, and let $n_0(y)$ represent the parent of node $y$. Then $$l^{(A)}(y^n) = \lceil -\log p^{(A)}(y^n) \rceil + 1$$

$$= \left\lceil \sum_{i=1}^{n} -\log p^{(A)}(n(y_i)) \right\rceil + 1$$

$$= \left\lceil \sum_{i=1}^{n} \left( -\log p^{(A)}(n_0(y_i)) - \log \frac{Q(n(y_i))}{\sum_{k=1}^{K(n_0(y_i))} Q(n_0(y_i)k)} \right) \right\rceil + 1 <$$

$$\sum_{i=1}^{n} l^\star(y_i) + 2$$

where $l^\star(\ )$ is the optimal length function specified in Theorem 2. Thus the description length $l^{(A)}(y^n)$ in coding data sequence $y^n$ using a 1-dimensional "matched arithmetic code" $\gamma_{Y,P(Y)}^{(A)}$ satisfies $(1/n)l^{(A)}(y^n) < (1/n)\sum_{i=1}^{n}l^\star(y_i) + 2/n$, giving a normalized description length arbitrarily close to the optimum for $n$ sufficiently large. We deal with floating point precision issues using the same techniques applied to traditional arithmetic codes.

As an example, again consider the p.m.f. of Table 3 and the partition of FIG. 10A. If $Y_1 \in \{a_3,a_6,a_7\}$, $[0,1)$ is broken into subintervals $[0, 0.21)$ for group $(a_3,a_6)$ and $[0.21,1)$ for group $(a_7)$, since $$p^{(A)}((a_3, a_6)) = p^{(A)}(r) \frac{Q((a_3, a_6))}{Q(r) - q(r)} = .21$$

$$p^{(A)}((a_7)) = p^{(A)}(r) \frac{Q((a_7))}{Q(r) - q(r)} = .79.$$

If $Y_1 \in \{a_0,a_1,a_2\}$, $[0,1)$ is broken into subintervals $[0, 0.21)$ for group $(a_3,a_6)$, $[0.21, 0.33)$ for group $(a_0)$, $[0.33, 0.56)$ for group $(a_1)$, and $[0.56, 1)$ for group $(a_2)$ since $$p^{(A)}((a_0)) = p^{(A)}((a_7)) \frac{Q((a_0))}{Q((a_7)) - q((a_7))} = .79 \frac{.1}{.79 - .13} = .12$$

$$p^{(A)}((a_1)) = p^{(A)}((a_7)) \frac{Q((a_1))}{Q((a_7)) - q((a_7))} = .79 \frac{.19}{.79 - .13} = .23$$

$$p^{(A)}((a_2)) = p^{(A)}((a_7)) \frac{Q((a_2))}{Q((a_7)) - q((a_7))} = .79 \frac{.37}{.79 - .13} = .44.$$

Finally, if $Y_1 \in \{a_4,a_5\}$, $[0, 1)$ is broken into subintervals $[0, 0.21)$ for group $(a_3, a_6)$, $[0.21, 0.33)$ for group $(a_0)$, $[0.33, 0.56)$ for group $(a_1)$, $[0.56, 0.84)$ for group $(a_4)$, and $[0.84, 1)$ for group $(a_5)$ since $$p^{(A)}((a_4)) = p^{(A)}((a_2)) \frac{Q((a_4))}{Q((a_2)) - q((a_2))} = .44(.11/(.37 - .2)) = .2847$$

$$p^{(A)}((a_5)) = p^{(A)}((a_2)) \frac{Q((a_5))}{Q((a_2)) - q((a_2))} = .44(.06/(.37 - .2)) = .1553.$$

FIG. 12B shows these intervals.

FIG. 12C shows the recursive interval refinement procedure for $Y^5 = (a_7 a_3 a_4 a_1 a_2)$. Symbol $Y_1 = a_7$ gives interval $[0, 0.21)$ of length 0.79 (indicated by the bold line). Symbol $Y_2 = a_3$ refines the above interval to the interval $[0.21, 0.3759)$ of length $0.21 \cdot 0.79 = 0.1659$. Symbol $Y_3 = a_4$ refines that interval to the interval [0.3024, 0.3500) of length 0.28·0.1659=0.0472. This procedure continues until finally we find the interval [0.3241, 0.3289).

Notice that the intervals of some symbols overlap in the matched arithmetic code. For example, the intervals associated with symbols $a_4$ and $a_5$ subdivide the interval associated with symbol $a_2$ in the previous example. These overlapping intervals correspond to the situation where one symbol's description is the prefix of another symbol's description in matched Huffman coding. Again, for any legitimate partition P(Y), the decoder can uniquely distinguish between symbols with overlapping intervals to correctly decode $Y^n$ using its side information about $X^n$.

Optimal Partitions: Definitions and Properties

The above describes optimal Shannon, Huffman, and arithmetic codes for matched lossless side-information coding with a given partition P(Y). The partition yielding the best performance remains to be found. Here we describe finding optimal partitions for Huffman and arithmetic coding.

Given a partition P(Y), let $l_{P(Y)}^{(H)}$ and $l_{P(Y)}^\star$ be the Huffman and optimal description lengths respectively for P(Y). We say that P(Y) is optimal for matched Huffman side-information coding on p(x,y) if $\text{El}_{P(Y)}^{(H)}(Y) \leq \text{El}_{P'(Y)}^{(H)}(Y)$ for any other partition P'(Y) for p(x,y) (and therefore, by Theorems 1 and 3, $\text{El}_{P(Y)}^{(H)}(Y) \leq \text{El}(Y)$ where l is the description length for any other instantaneous lossless side-information code on p(x,y). We say that P(Y) is optimal for matched arithmetic side-information coding on p(x,y) if $\text{El}_{P(Y)}^\star(Y) \leq \text{El}_{P'(Y)}^\star(Y)$ for any other partition P'(Y) for p(x,y).

Some properties of optimal partitions follow. Lemma 2 demonstrates that there is no loss of generality associated with restricting our attention to partitions P(Y) for which the root is the only empty internal node. Lemma 3 shows that each subtree of an optimal partition tree is an optimal partition on the sub-alphabet it describes. Lemmas 2 and 3 hold under either of the above definitions of optimality. Lemma 4 implies that an optimal partition for matched Huffman coding is not necessarily optimal for arithmetic coding, as shown in Corollary 1. Properties specific to optimal partitions for Huffman coding or optimal partitions for arithmetic coding follow.

Lemma 2 There exists an optimal partition $P^\star(Y)$ for p(x,y) for which every node except for the root of $P^\star(Y)$ is non-empty and no node has exactly one child.

Proof: If any non-root node n of partition P(Y) is empty, then removing n, so $\{nk\}_{k=1}^{K(n)}$ descend directly from n's parent, gives new partition P'(Y). Any matched code on P(Y), including the optimal matched code on P(Y), is a matched code on P'(Y). If n has exactly one child, then combining n and its child yields a legitimate partition P'(Y); the optimal matched code for P'(Y) yields expected rate no worse than that of the optimal matched code for P(Y). □

Lemma 3 If $T_1, \ldots, T_m$ are the subtrees descending from any node n in optimal partition $P^\star(Y)$ for p(x,y), then the tree where $\{T_1, \ldots, T_m\}$ descend from an empty root is identical to $T(P^\star(\hat Y))$ where $P^\star(\hat Y)$ is an optimal partition of $\hat Y = \cup_{i=1}^m T_i$ for p(x,y).

Proof: Since the matched code's description can be broken into a description of n followed by a matched code on $\{T_1, \ldots, T_m\}$ and the corresponding description lengths add, the partition described by T(P(Y)) cannot be optimal unless the partition described by $\{T_1, \ldots, T_m\}$ is. □

Lemma 4 Let $p_1$ and $p_2$ denote two p.m.f.s for alphabet $Y_1$ and $Y_2$ respectively, and use H(p) and $R^{(H)}(p)$ to denote the entropy and expected Huffman coding rate, respectively, for p.m.f. p. Then, $H(p_1) \geq H(p_2)$ does not imply $R^{(H)}(p_1) \geq R^{(H)}(p_2)$.

Proof: The following example demonstrates this property. Let $p_1=\{0.5, 0.25, 0.25\}$, $p_2=\{0.49, 0.49, 0.02\}$ then $H(p_1)=1.5$, $H(p_2)=1.12$. However, the rate of the Huffman tree for $p_1$ is 1.5, while that for $p_2$ is 1:51. □

Corollary 1 The optimal partitions for matched Huffman side-information coding and matched arithmetic side-information coding are not necessarily identical.

Proof: The following example demonstrates this property. Let alphabet $Y=\{b_0,b_1,b_2,b_3,b_4\}$ have marginal p.m.f. $\{0.49, 0.01, 0.25, 0.24, 0.01\}$, and suppose that $P_1(Y)=\{(b_0,b_1), (b_2), (b_3,b_4)\}$ and $P_2(Y)=\{(b_0), (b_2,b_3), (b_1,b_4)\}$ are partitions of Y for p(x,y). The node probabilities of $P_1(Y)$ and $P_2(Y)$ are $p_1=\{0.5, 0.25, 0.25\}$ and $p_2=\{0.49, 0.49, 0.02\}$, respectively. By the proof of Lemma 4, $P_1(Y)$ is a better partition for Huffman coding while $P_2(Y)$ is better for arithmetic coding. □

In the arguments that follow, we show that there exist pairs of groups ($G_I$, $G_J$) such that $G_I \cap G_J = \emptyset$; but $G_I$ and $G_J$ cannot both descend from the root of an optimal partition. This result is derived by showing conditions under which there exists a group $G^\star$ that combines the members of $G_I$ and $G_J$ and for which replacing $\{G_I, G_J\}$ with $\{G^\star\}$ in P(Y) guarantees a performance improvement.

The circumstances under which "combined" groups guarantee better performance than separate groups differ for arithmetic and Huffman codes. Theorems 4 and 5 treat the two cases in turn. The following definitions are needed to describe those results.

We say that 1-level groups $G_1$ and $G_2$ (or nodes $T(G_1)$ and $T(G_2)$) can be combined under p(x,y) if each pair $y_1 \in G_1$, $y_2 \in G_2$ can be combined under p(x,y).

Figure 10D:
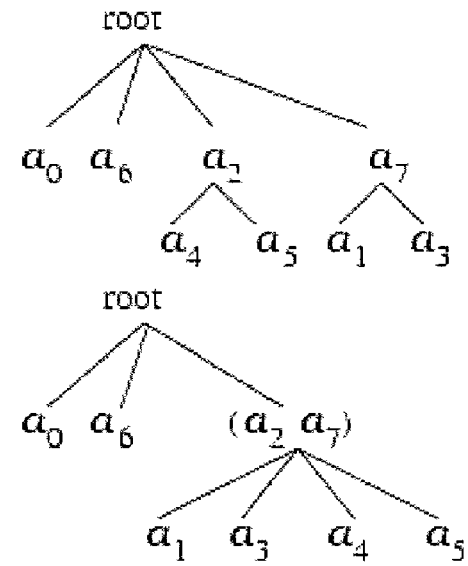

If $G_I, G_J \in P(Y)$, so that $G_I$ and $G_J$ extend directly from the root r of T(P(Y)) and nodes I and J are the roots of $T(G_I)$ and $T(G_J)$, and $G_o$ denotes the 1-level group at some node $_o$ in $T(G_J)$, we say that $G_I$ can be combined with $G_J$ at $n_o$ if (1) I can be combined with $n_o$ and each of $n_o$3 s descendants in $T(G_J)$ and (2) $n_o$ and each of $n_o$'s ancestors in $T(G_J)$ can be combined with I and each of I's descendants in $T(G_I)$. The result of combining $G_I$ with $G_J$ at $G_o$ is a new group $G^\star$. Group $G^\star$ modifies $G_J$ by replacing $G_o$ with 1-level group $(I, G_o)$ and adding the descendants of I (in addition to the descendants of $G_o$) as descendants of $(I, G_o)$ in $T(G^\star)$. FIG. 10D shows an example where groups $G_I=((a_2):\{(a_4), (a_5)\})$ and $G_J=((a_7):\{(a_3)\})$ of partition $P(Y)=\{(a_0), G_I, G_J, (a_6)\}$ combine at $(a_2)$. The modified partition is $P^\star(Y)=\{(a_0), G^\star, (a_6)\}$, where $G^\star=((a_2, a_7):\{(a_1), (a_3), (a_4), (a_5)\})$.

Lemma 5 For any constant A>0, the function f'(x)=x log (1+A/x) is monotonically increasing in x for all x>0.

Proof: The 1st order derivative of f(x) is f'(x)=log (1+A/x)−A/(x+A). Let u=A/x, $g(u)=f'(x)|_{x=A/u}=\log(1+u)-u/(u+1)$, then $u \geq 0$ and g(0)=0. The 1st order derivative of g(u) is $g'(u)=u/(u+1)^2$. For any u>0, g'(u)>0, thus g(u)>0. So for any x>0, f'(x)>0, that is, f(x) is monotonically increasing in x. □

Theorem 4 Let $P(Y)=\{G_1, \ldots G_m\}$ be a partition of y under p(x,y). Suppose that $G_I \in P(Y)$ can be combined with $G_J \in P(Y)$ at $G_o$, where $G_o$ is the 1-level group at some node $n_o$ of $T(G_J)$. Let $P^\star(Y)$ be the resulting partition. Then $El_{P^\star(Y)}^\star(Y) \leq El_{P(Y)}^\star(Y)$.

Figure 16:
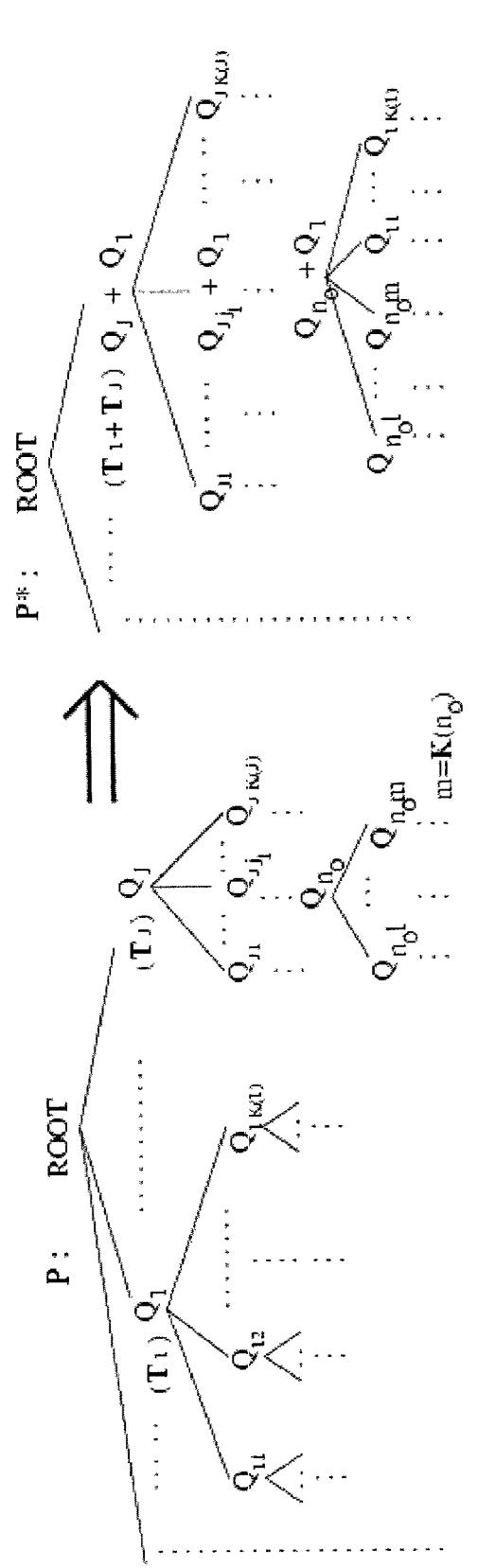
FIG. 16 is diagram showing how two groups are combined according to one embodiment of the invention.

Proof: Let $n_o = Jj_1, \ldots jM = n_p jM$, so that $n_o$'s parent is $n_p$. Define $S_1 = \{Jj_1 \ldots j_i : 1 \leq i \leq M\}$ (i.e. the set of nodes on the path to $n_o$, excluding node J); $S_2 = \{n \in T(G_J): $ is n the sibling of node s$\}$, $s \in S_1$, $S_3 = (S_1 \cup \{J\}) \cap \{n_o\}^c$ (i.e. the set of nodes on the path to $n_o$, excluding node $n_o$). For any node $n \in T(P(Y))$, let $Q_n$ and $q_n$ denote the subtree and node probabilities respectively of node n in $T(P(Y))$, and define $\Delta Q_n = Q_n - q_n = \Sigma_{J=1}^{K(n)} Q_{nj}$. Then FIG. 16 shows the subtree probabilities associated with combining $G_I$ with $G_J$ at $G_o$. Let the resulting new group be $G^\star$.

Note that the sum of the subtree probabilities of $G_I$ and $G_J$ equals the subtree probability of $G^\star$, and thus the optimal average rate of the groups in $P(Y) \cap \{G_I, G_J\}^c$ are not changed by the combination. Thus if $(\bar{l}_I, \bar{l}_J)$ and $(\bar{l}_I^\star, \bar{l}_J^\star)$ are the optimal average rates for $(G_I, G_J)$ in P(Y) and $P^\star(Y)$, respectively, then $\Delta \bar{l}_I + \Delta \bar{l}_J = (\bar{l}_I - \bar{l}_I^\star) + (\bar{l}_J - \bar{l}_J^\star)$ gives the total rate cost of using partition P(Y) rather than partition $P^\star(Y)$. Here $$-\bar{l}_I = Q_I \log Q_I + \sum_{k=1}^{K(I)} Q_{Ik} \log \frac{Q_{Ik}}{\Delta Q_I} + \Delta l_I$$

$$-\bar{l}_I^\star = Q_I \log \left((Q_I + Q_J) \prod_{nk \in S_1} \frac{Q_I + Q_{nk}}{Q_I + \Delta Q_n}\right) + \sum_{k=1}^{K(I)} Q_{Ik} \log \frac{Q_{Ik}}{\Delta Q_I + \Delta Q_{n_o}} + \Delta l_I$$

$$\Delta \bar{l}_I = Q_I \log \left(\frac{Q_I + Q_J}{Q_I} \prod_{nk \in S_1} \frac{Q_I + Q_{nk}}{Q_I + \Delta Q_n}\right) + \sum_{k=1}^{K(I)} Q_{Ik} \log \Delta \frac{Q_I}{\Delta Q_I + \Delta Q_{n_o}}$$

$$= Q_I \log \left(\frac{Q_I + Q_J}{Q_I + \Delta Q_J} Q_I + \frac{Q_{J_1}}{Q_I + \Delta Q_{J_1}} \cdots \frac{Q_I + Q_{n_p}}{Q_I + \Delta Q_{n_p}} Q_I + \frac{Q_{n_o}}{Q_I}\right) +$$

$$\Delta Q_I \log \Delta \frac{Q_I}{\Delta Q_I + \Delta Q_{n_o}}$$

$$= Q_I \log \prod_{n \in S_3} \frac{Q_I + Q_n}{Q_I + \Delta Q_n} + Q_I \log \left(1 + \frac{Q_{n_o}}{Q_I}\right) - \Delta Q_I \log \left(1 + \frac{\Delta Q_{n_o}}{\Delta Q_I}\right),$$

where $\Delta l_I$ represents the portion of the average rate unchanged by the combination of $G_I$ and $G_J$.

It follows that $\Delta \bar{l}_I \geq 0$ since $\log_{n \in S_3}(Q_I + Q_n)/(Q_I + \Delta Q_n) \geq 0$ and since x log(1+c/x) is monotonically increasing in x>0 and c>0 implies that $$\Delta Q_I \log \left(1 + \frac{\Delta Q_{n_o}}{\Delta Q_I}\right) \leq \Delta Q_I \log \left(1 + \frac{Q_{n_o}}{\Delta Q_I}\right) \leq Q_I \log \left(1 + \frac{Q_{n_o}}{Q_I}\right)$$

Similarly, using $\Delta l_J$ as the portion of $\bar{l}_J$ unchanged by the combination, $$-\bar{l}_J = Q_J \log Q_J + \sum_{nk \in S_1 \cup S_2} Q_{nk} \log \frac{Q_{nk}}{\Delta Q_n} + \sum_{k=1}^{K(n_o)} Q_{n_o k} \log \frac{Q_{n_o k}}{\Delta Q_{n_o}} + \Delta l_J$$

$$-\bar{l}_J^\star = Q_J \log(Q_J + Q_I) + \sum_{nk \in S_1} Q_{nk} \log Q_{nk} + \frac{Q_I}{\Delta Q_n + Q_I} +$$

-continued $$\sum_{nk \in S_2} Q_{nk} \log \frac{Q_{nk}}{\Delta Q_n + Q_I} + \sum_{k=1}^{K(n_o)} Q_{n_o k} \log \frac{Q_{n_o k}}{\Delta Q_{n_o} + \Delta Q_I} + \Delta L_J$$

$$\Delta \bar{l}_J = Q_J \log \left(\frac{Q_J + Q_I}{Q_J}\right) + \sum_{nk \in S_1} Q_{nk} \log Q_{nk} + \frac{Q_I}{Q_{nk}} +$$

$$\sum_{nk \in S_1} Q_{nk} \log \Delta \frac{Q_n}{\Delta Q_n + Q_I} + \sum_{nk \in S_2} Q_{nk} \log \Delta \frac{Q_n}{\Delta Q_n + Q_I} +$$

$$\sum_{k=1}^{K(n_o)} Q_{n_o k} \log \Delta \frac{Q_{n_o}}{\Delta Q_{n_o} + \Delta Q_I}$$

$$= Q_J \log \left(1 + \frac{Q_I}{Q_J}\right) + \sum_{n \in S_1} Q_n \log \left(1 + \frac{Q_I}{Q_n}\right) - \sum_{n \in S_3} \Delta Q_n \log \left(1 + \frac{Q_I}{\Delta Q_n}\right) -$$

$$\Delta Q_{n_o} \log \left(1 + \frac{\Delta Q_I}{\Delta Q_{n_o}}\right)$$

$$\geq \sum_{n \in S_1 \cup S_3} \left[Q_n \log \left(1 + \frac{Q_I}{Q_n}\right) - \Delta Q_n \log \left(1 + \frac{Q_I}{\Delta Q_n}\right)\right]$$

Thus $\Delta \bar{l}_J \geq 0$ by the monotonicity of x log(1+c/x). Since the optimal rates of $G_I$ and $G_J$ both decrease after combining, we have the desired result.

Unfortunately, Theorem 4 does not hold for matched Huffman coding. Theorem 5 shows a result that does apply in Huffman coding.

Theorem 5 Given partition P(Y) of Y on p(x,y), if $G_I, G_J \in P(Y)$ satisfy: (1) $G_I$ is a 1-level group and (2) $G_I$ can be combined with $G_J$ at root J of $T(G_J)$ to form partition $P^\star(Y)$ then $El_{P^\star_y}^{(H)}(Y) \leq El_{P(Y)}^{(H)}(Y)$.

Proof: Let $\alpha$ denote the matched Huffman code for P(Y), and use $\alpha_I$ and $\alpha_J$ to denote this code's binary descriptions for nodes I and J. The binary description for any symbol in $G_I$ equals $\alpha_I(\alpha(y) = \alpha_I$ for each $y \in G_I$) while the binary description for any symbol in $G_J$ has prefix $\alpha_J(\alpha(y) = \alpha_J \alpha'(y)$ for each $y \in G_J$, where $\alpha'$ is a matched Huffman code for $G_J$). Let $\alpha^{min}$ be the shorter of $\alpha_I$ and $\alpha_J$. Since $\alpha$ is a matched Huffman code for P(Y) and $P^\star(Y)$ is a partition of Y on p(x,y), $$\alpha^\star(y) = \begin{cases} \alpha_{min} & \text{if } y \in G_I \\ \alpha_{min} \alpha'(y) & \text{if } y \in G_J \\ \alpha(y) & \text{otherwise} \end{cases}$$

is a matched code for $P^\star(Y)$. Further, $|\alpha_{min}| \leq |\alpha_I|$ and $|\alpha_{min}| \leq |\alpha_J|$ imply that the expected length of $\alpha^\star(Y)$ is less than or equal to the expected length of $\alpha(Y)$ (but perhaps greater than the expected length of the matched Huffman code for $P^\star(Y)$).

General Lossless Instantaneous MASCs: Problem Statement, Partition Pairs, and Optimal Matched Codes We here drop the side-information coding assumption that X (or Y) can be decoded independently and consider MASCs in the case where it may be necessary to decode the two symbol descriptions together. Here, the partition P(Y) used in lossless side-information coding is replaced by a pair of partitions (P(X), P(Y)). As in side-information coding, P(X) and P(Y) describe the prefix and equivalence relationships for descriptions $\{\gamma_X(X):x \in X\}$ and $\{\gamma_Y(Y):y \in Y\}$, respectively. Given constraints on (P(X), P(Y)) that are both necessary and sufficient to guarantee that a code with the prefix and equivalence relationships described by (P(X), P(Y)) yields an MASC that is both instantaneous and lossless, Theorem 1 generalizes easily to this coding scenario, so every general instantaneous lossless MASC can be described as a matched code on P(X) and a matched code on P(Y) for some (P(X), P(Y)) satisfying the appropriate constraints.

In considering partition pairs (P(X), P(Y)) for use in lossless instantaneous MASCs, it is necessary but not sufficient that each be a legitimate partition for side information coding on its respective alphabet. (If P(Y) fails to uniquely describe Y when the decoder knows X exactly, then it must certainly fail for joint decoding as well. The corresponding statement for P(X) also holds. These conditions are, however, insufficient in the general case, because complete knowledge of X may be required for decoding with P(Y) and vice versa.) Necessary and sufficient conditions for (P(X), P(Y)) to give an instantaneous MASC and necessary and sufficient conditions for (P(X), P(Y)) to give a lossless MASC follow.

For (P(X), P(Y)) to yield an instantaneous MASC, the decoder must recognize when it reaches the end of $\gamma_X(X)$ and $\gamma_Y(Y)$. The decoder proceeds as follows. We think of a matched code on p as a multi-stage description with each stage corresponding to a level in T(P). Starting at the roots of T(P(X)) and T(P(Y)), the decoder reads the first-stage descriptions of $\gamma_X(X)$ and $\gamma_Y(Y)$, traversing the described paths from the roots to nodes $n_x$ and $n_y$ in partitions T(P(X)) T(P(Y)) respectively. (The decoder can determine that it has reached the end of a single stage description if and only if the matched code is itself instantaneous.) If either of the nodes reached is empty, then the decoder knows that it must read more of the description; thus we assume, without loss of generality, that $n_x$ and $n_y$ are not empty. Let $T_x$ and $T_y$ be the subtrees descending from $n_x$ and $n_y$ (including $n_x$ and $n_y$ respectively). (The subtree descending from a leaf node is simply that node.) For instantaneous coding, one of the following conditions must hold:

(A) $X \in T_x$ or $n_x$ is a leaf implies that $Y \in n_y$, and $Y \in T_y$ or $n_y$ is a leaf implies that $X \in n_x$;

(B) $X \in T_x$ implies that $Y \notin n_y$;

(C) $Y \in T_y$ implies that $X \notin n_x$.

Under condition (A), the decoder recognizes that it has reached the end of $\gamma_X(X)$ and $\gamma_Y(Y)$. Under condition (B), the decoder recognizes that it has not reached the end of $\gamma_Y(Y)$ and reads the next stage description, traversing the described path in T(P(Y)) to node $n'_y$ with subtree $T'_y$. Condition (C) similarly leads to a new node $n'_x$ and subtree $T'_x$. If none of these conions holds, then the decoder cannot determine whether to continue reading one or both of the descriptions, and the code cannot be instantaneous. The decoder continues traversing T(P(X)) and T(P(Y)) until it determines the 1-level groups $n_x$ and $n_y$ with $X \in n_x$ and $Y \in n_y$. At each step before the decoding halts, one (or more) of the conditions (A), (B), and (C) must be satisfied.

For (P(X), P(Y)) to give a lossless MASC, for any (x,y)∈X×Y with p(x,y)>0 following the above procedure on ($\gamma_X(X)$, $\gamma_Y(Y)$) must lead to final nodes ($n_x$, $n_y$) that satisfy:

(D) (x,y)∈$n_x$×$n_y$ and for any other x'∈$n_x$ and y'∈$n_y$, p(x,y')=p(x',y)=p(x',y')=0

The following lemma gives a simplified test for determining whether partition pair (P(X), P(Y)) yields a lossless instantaneous MASC. We call this test the MASC prefix condition. Lemma 6 reduces to Lemma 1 when either P(x)={{x}:x∈X} or P(Y)={{y}:y∈y}. In either of these cases, the general MASC problem reduces to the side information problem of Section II.

Lemma 6 Partition pair (P(X), P(Y)) for p(x,y) yields a lossless instantaneous MASC if and only if for any x,x'∈X such that {$\gamma_X(X)$, $\gamma_X(X')$} does not satisfy the prefix condition, {γy:y∈$A_x \cup A_{x'}$} satisfies the prefix condition and for any y,y'∈y such that {$\gamma_Y(Y)$, $\gamma_Y(Y')$} does not satisfy the prefix condition, {$\gamma_X(X)$:x∈$B_y \cup B_{y'}$} satisfies the prefix condition. Here $B_y$={x∈X:p(x,y)>0}.

Proof: First, we show that if lossless instantaneous MASC decoding fails, then the MASC prefix condition must be violated. If lossless instantaneous MASC decoding fails, then there must be a time in the decoding procedure, that we decode to nodes ($n_x$, $n_y$) with subtrees $T_x$ and $T_y$, but one of the following occurs:

(1) none of the conditions (A), (B), or (C) is satisfied;

(2) condition (A) is satisfied, but condition (D) is violated.

In case (1), one of the following must happen: (a) the decoder determines that $Y \in n_y$, but cannot determine whether or not $X \in n_x$; (b) the decoder determines that $X \in n_x$, but cannot determine whether or not $Y \in n_y$; (c) the decoder cannot determine whether or not $Y \in n_y$ or whether or not $X \in n_x$. If (a) occurs, then there must exist Y, y'∈$n_y$, x∈$n_x$, and x'∈$T_x \cap n_x^c$ with p(x,y)p(x',y)>0 or p(x,y)p(x',y')>0, which means x,x'∈$B_y \cup B_{y'}$. If (b) occurs, then there must exist x,x'∈$n_x$, y∈$n_y$, and y'∈$T_y \cap n_y^c$ with p(x,y)p(x,y')>0 or p(x,y)p(x',y')>0, which means y,y'∈$A_x \cup A_{x'}$. If (c) occurs, then there must exist x∈$n_x$, x'∈$T_x \cap n_x^c$, y∈$n_y$, and y'∈$T_y \cap n_y^c$ with p(x,y)p(x',y')>0 or p(x',y)p(x,y')>0, which means y,y'∈$A_x \cup A_{x'}$. Thus in subcases (a), (b), and (c) of case (1) the MASC prefix condition is violated.

In case (2), assume the true values of (X,Y) are (x,y), then one of the following must occur: (a) we decode Y=y but cannot decode X; (b) we decode X=x but cannot decode Y; (c) we can decode neither X nor Y. If (a) occurs, then there must exist an x' ∈$n_x$ with p(x',y)>0, which means x,x'∈$B_y$. If (b) occurs, then there must exist a y'∈$n_y$ with p(x,y')>0, which means y,y'∈$A_x$. If (c) occurs, then there must exist x'∈$n_x$ and y'∈$n_y$ with p(x',y)>0 or p(x,y')>0 or p(x',y)>0, which means x,x'∈$B_y \cup B_{y'}$, or y,y'∈$A_x \cup A_{x'}$. Thus in subcases (a), (b), (c) of case (2) the MASC prefix condition is likewise violated.

Next, we show that if the MASC prefix condition is violated, then we cannot achieve a lossless instantaneous MASC. Here we use $n_x$ and $n_y$ to denote the nodes of the partition tree satisfying x∈$n_x$ and y∈$n_y$. We assume symbols x,x'∈X and y,y'∈Y satisfy y,y'∈$A_x \cup A_{x'}$ and x,x'∈$B_y \cup B_{y'}$, but $\gamma_X(X)$ and $\gamma_X(X')$ do not satisfy the prefix condition, and $\gamma_Y(Y)$ and $\gamma_Y(Y')$ do not satisfy the prefix condition; i.e. the MASC prefix condition is violated. Then one of the following must hold:

$\gamma_X(X) = \gamma_X(X')$ and $\gamma_Y(Y) = \gamma_Y(Y')$; (1)

$\gamma_X(X) = \gamma_X(X')$ and $\gamma_Y(Y)$ is the prefix of $\gamma_Y(Y')$; (2)

$\gamma_Y(Y) = \gamma_Y(Y')$ and $\gamma_X(X)$ is the prefix of $\gamma_X(X')$; (3)

$\gamma_X(X)$ is the prefix of $\gamma_X(X')$ and $\gamma_Y(Y)$ is the prefix of $\gamma_Y(Y')$; (4).

In case (1), there must be a time in the decoding procedure that the decoder stops at $(n_x, n_y)$ and determines that $X \in n_x$; $Y \in n_y$. However, since $y, y' \in A_x \cup A_{x'}$, all of the following are possible given $X \in n_x$ and $Y \in n_y$: (a) $y \in A_x \cap A_{x'}^c$ and $y' \in A_x \cap A_{x'}^c$; (b) $y \in A_x \cap A_{x'}^c$ and $y' \in A_x \cap A_{x'}^c$; (c) $y, y' \in A_x \cap A_{x'}$. Thus the decoder cannot determine which of the following symbols was described: (x,y), (x,y'), (x',y) or (x',y').

In case (2), there must be a time in the decoding procedure that the decoder reaches $(n_x, n_y)$ and determines that $X \in n_x$. However, as in case (1), all of the three possibilities can happen, and the decoder does not have extra information to determine whether or not $Y \in n_y$.

In case (3), there must be a time in the decoding procedure that the decoder reaches $(n_x, n_y)$ and determines that $Y \in n_y$. However, as in case (1), all of the three possibilities can happen, and the decoder does not have extra information to determine whether or not $X \in n_x$.

In case (4), there must be a time in the decoding procedure, that the decoder reaches $(n_x, n_y)$ and needs to determine whether or not $X \in n_x$ and whether or not $Y \in n_y$. However, again as in case (1), all of the three possibilities can happen, and the decoder does not have extra information to instantaneously decode. □

Optimality of a matched code for partition P(Y) is independent of whether P(Y) is used in a side-information code or an MASC. Thus our optimal matched code design methods from lossless side-information coding apply here as well, giving optimal matched Shannon, Huffman, and arithmetic codes for any partition pair (P(X), P(Y)) for p(x,y) that satisfies the MASC prefix condition.

Optimal Partition Properties

Given a partition pair (P(X), P(Y)) that satisfies the MASC prefix condition, (P(X), P(Y)) is optimal for use in a matched Huffman MASC on p(x,y) if $(El_{P(X)}^{(H)}(X), El_{P(Y)}^{(H)}(Y))$ sits on the lower boundary of the rates achievable by a lossless MASC on alphabet X×Y. Similarly, (P(X), P(Y)) is optimal for use in a matched arithmetic MASC on p(x,y) if $(El_{P(X)}^{\star}(X), El_{P(Y)}^{\star}(Y))$ sits on the lower boundary of the rates achievable by a lossless MASC on alphabet X×Y. Again $l_P^{(H)}$ and $l_P^{\star}$ denote the Huffman and optimal description lengths respectively for partition P, and Huffman coding is optimal over all codes on a fixed alphabet. (Mixed codes (e.g., Huffinan coding on X and arithmetic coding on Y) are also possible within this framework.) While the lower convex hull of the rate region of interest is achievable through time sharing, we describe the lower boundary of achievable rates rather than the convex hull of that region in order to increase the richness of points that can be achieved without time sharing. This region describes points that minimize the rate needed to describe Y subject to a fixed constraint on the rate needed to describe X or vice versa. The regions are not identical since the curves they trace are not convex. Their convex hulls are, of course, identical.

Using Lemma 7, we again restrict our attention to partitions with no empty nodes except for the root. The proof of this result does not follow immediately from that of the corresponding result for side-information codes. By Lemma 6, whether or not two symbols can be combined for one alphabet is a function of the partition on the other alphabet. Thus we must here show not only that removing empty nodes does not increase the expected rate associated with the optimal code for a given partition but also that it does not further restrict the family of partitions allowed on the other alphabet.

Lemma 7 For each partition pair (P(X), P(Y)) that achieves performance on the lower boundary of the achievable rate region, there exists a partition pair $(P^\star(X), P^\star(Y))$ achieving the same rate performance as (P(X), P(Y)), for which every node except for the roots of $P^\star(X)$ and $P^\star(Y)$ is non-empty and no node has exactly one child.

Proof: Case 1: If any non-root node n of partition P(X) is empty, then we remove n, so $\{nk\}_{k=1}^{K(n)}$ descend directly from n's parent. Case 2: If any node n has exactly one child n1, then we combine n and n1 to form 1-level group (n, n1) with $\{n1k\}_{k=1}^{K(n1)}$ descending directly from (n, n1). In both cases, the rate of the new partition does not increase and the prefix condition among P(X)'s non-empty nodes is unchanged, thus the symbols of y that can be combined likewise remains the same by Lemma 6.

Partition Design

By Lemma 6, whether or not two symbols can be combined in a general MASC is a function of the partition on the other alphabet. Fixing one partition before designing the other allows us to fix which symbols of the second alphabet can and cannot be combined and thereby simplifies the search for legitimate partitions on the second alphabet. In the discussion that follows, we fix P(Y) and then use a variation on the partition search algorithm of lossless side-information coding to find the best P(Y) for which (P(X), P()) yields an instantaneous lossless MASC. Traversing all P(X) allows us to find all partitions with performances on the lower boundary of the achievable rate region.

To simplify the discussion that follows, we modify the terminology used in lossless side-information coding to restrict our attention from all partitions on y to only those partitions P(Y) for which (P(X), P(Y)) satisfies the MASC prefix condition given a fixed P(X). In particular, using Lemma 6, symbols y and y' can be combined given P(X) if and only if there does not exist an $x, x' \in X$ such that $\gamma_X(X) \leq \gamma_X(X')$ and $y, y' \in A_x \cup A_{x'}$. (Here $\gamma_X(X)$ is any matched code for P(X).) Equivalently, y and y' can be combined given P(X) if for each pair $x, x' \in X$ such that $\gamma_X(X) \leq \gamma_X(X')$, $(p(x, y) + p(x', y))(p(x, y') + p(x', y')) = 0$. Given this new definition, the corresponding definitions for M-level groups, partitions on Y, and matched codes for partitions on Y for a fixed P(X) follow immediately.

Next consider the search for the optimal partition on Y given a fixed partition P(X). We use $P^\star(Y|P(X))$ to denote this partition. The procedure used to search for $P^\star(Y|P(X))$ is almost identical to the procedure used to search for the optimal partition in side-information coding. First, we determine which symbols from Y can be combined given P(X). In this case, for each node $n \in T(P(X))$, if $T_n$ is the subtree of T(P(X)) with root n, then for each $n' \in T_{nk}$ with $k \in \{1, \ldots, K(n)\}$, symbols $y, y' \in A_n \cup A_{n'}$ cannot be combined given P(X). Here $A_n = \{y : y \in A_x, x \in n\}$. Traversing the tree from top to bottom yields the full list of pairs of symbols that cannot be combined given P(X). All pairs not on this list can be combined given P(X). Given this list, we construct a list of groups and recursively build the optimal partition $P^\star(Y|P(X))$ using the approach described in an earlier section.

Given a method for finding the optimal partition $P^\star(Y|P(X))$ for a fixed partition P(X), we next need a means of listing all partitions P(X). (Note that we really wish to list all P(X), not only those that would be optimal for side-information coding. As a result, the procedure for constructing the list of groups is slightly different from that in lossless side-information information coding.) For any alphabet $X' \subseteq X$, the procedure begins by making a list $L_{X'}$ of all (singleor multi-level) groups that may appear in a partition of X' for p(x,y) satisfying Lemma 7 (i.e. every node except for the root is non-empty, and K(n)≠1). The list is initialized as $L_{X'}=\{(x):x \in X'\}$. For each symbol $x \in X'$ and each non-empty subset $S \subseteq \{z \in X':z$ can be combined with x under $p(x,y)\}$, we find the set of partitions $\{P(S)\}$ of S for p(x,y); for each P(S), we add x to the empty root of T(P(S)) if P(S) contains more than one group or to the root of the single group in P(S) otherwise; then we add the resulting new group to $L_{X'}$ if $L_{X'}$ does not yet contain the same group.

After constructing the above list of groups, we build a collection of partitions of X' made of groups on that list. If any group $G \in L_{X'}$ contains all of the elements of X', then $\{G\}$ is a complete partition. Otherwise, the algorithm systematically builds a partition, adding one group at a time from $L_{X'}$ to set P(X') until P(X') is a complete partition. For $G \in L_{X'}$ to be added to P(X'), it must satisfy $G \cap G' = \emptyset$ for all $G' \in P(X')$. The collection of partitions for X' is named $L_{P(X')}$.

We construct the optimal partition $P^\star(Y|P(X))$ for each $P(X) \in L_{P(X)}$ and choose those partition pairs (P(X), P(Y)) that minimize the expected rate needed to describe Y given a fixed constraint on the expected rate needed to describe X (or vice versa).

Near-Lossless Instantaneous Multiple Access Source Coding: Problem Statement, Partition Pairs, and Optimal Matched Codes Finally, we generalize the MASC problem from lossless instantaneous side-information and general MASCs to near-lossless instantaneous side-information and general MASCs. For any fixed $\epsilon>0$, we call MASC $((\gamma X, \gamma Y), \gamma^{-1})$ a near-lossless instantaneous MASC for $P_e \leq \epsilon$ if $((\gamma X, \gamma Y), \gamma^{-1})$ yields instantaneous decoding with $P_e = \Pr(\gamma^{-1}(\gamma_X(X), \gamma_Y(Y)) \neq (X,Y)) \leq \epsilon$. For instantaneous decoding in a near-lossless MASC, we require that for any input sequences $x_1, x_2, x_3, \ldots$ and $y_1, y_2, y_3, \ldots$ with $p(x_1, y_1)>0$ the instantaneous decoder reconstructs some reproduction of $(x_1, y_1)$ by reading no more and no less than the first $|\gamma_X(x_1)|$ bits from $\gamma_X(x_1)\gamma_X(x_2)\gamma_X(x_3) \ldots$ and the first $|\gamma_Y(Y_1)|$ bits from $\gamma Y(y_1)\gamma_Y(Y_2)\gamma_Y(Y_3) \ldots$ (without prior knowledge of these lengths). That is, we require that the decoder correctly determines the length of the description of each (x,y) with p(x,y)>0 even when it incorrectly reconstructs the values of x and y. This requirement disallows decoding error propagation problems caused by loss of synchronization at the decoder.

Theorem 6 gives the near-lossless MASC prefix property. Recall that the notation $\gamma_Y(Y)>\gamma_Y(Y')$ means that $\gamma_Y(Y)$ is a proper prefix of $\gamma_Y(Y')$, disallowing $\gamma Y(y)=\gamma_Y(Y')$.

Theorem 6 Partition pair (P(X), P(Y)) can be used in a near-lossless instantaneous MASC on p(x,y) if and only if both of the following properties are satisfied:

(A) for any $x,x' \in X$ such that $\gamma_X(X) > \gamma_X(X')$, $\{\gamma_Y(Y):y \in A_x \cup A_{x'}\}$ is prefix free;

(B) for any $x,x' \in X$ such that $\gamma_X(X) = \gamma_X(X')$, $\{\gamma_Y(Y):y \in A_x \cup A_{x'}\}$ is free of proper-prefixes.

Proof. If either condition (A) or condition (B) is not satisfied, then there exist symbols $x,x' \in X$ and $y,y' \in Y$, such that $y,y' \in A_x \cup A_{x'}$, and one of the following is true:

(1) $\gamma_X(X) = \gamma_X(X')$ and $\gamma_Y(Y) > \gamma_Y(Y')$; (2) $\gamma_Y(Y) = \gamma Y(y')$ and $\gamma_X(X) > \gamma_X(X')$; (3) $\gamma_X(X) > \gamma_X(X')$ and $\gamma_Y(Y) > \gamma_Y(Y')$. In any of these cases, the decoder cannot determine where to stop decoding one or both of the binary descriptions by an argument like that in Lemma 6. The result is a code that is not instantaneous.

For the decoder to be unable to recognize when it has reached the end of $\gamma_X(X)$ and $\gamma_Y(Y)$, one of the followings must occur: (1) the decoder determines that $X \in n_x$, but cannot determine whether or not $Y \in n_y$; (2) the decoder determines that $Y \in n_y$, but cannot determine whether or not $X \in n_x$; (3) the decoder cannot determine whether or not $X \in n_x$ or $Y \in n_y$. Following the argument used Lemma 6, each of these cases leads to a violation of either (A) or (B) (or both).

Thus the near-lossless prefix property differs from the lossless prefix property only in allowing $\gamma_X(X) = \gamma_X(X')$ and $\gamma_Y(Y) = \gamma_Y(Y')$ when $y,y' \in A_x \cup A_{x'}$. In near-lossless side-information coding of Y given X this condition simplifies as follows. For any $y,y' \in Y$ for which there exists an $x \in X$ with $p(x,y)p(x,y')>0$, $\gamma_Y(Y)>\gamma_Y(Y')$ is disallowed (as in lossless coding) but $\gamma_Y(Y) = \gamma_Y(Y')$ is allowed (this was disallowed in lossless coding). In this case, giving y and y' descriptions $\gamma_Y(Y) \leq \gamma_Y(Y')$ would leave the decoder no means of determining whether to decode $|\gamma_Y(Y)|$ bits or $|\gamma_Y(Y')|$ bits. (The decoder knows only the value of x and both p(x,y) and p(x,y') are nonzero.) Giving y and y' descriptions $\gamma_Y(Y) = \gamma_Y(Y')$ allows instantaneous (but not error free) decoding; and the decoder decodes to the symbol with the given description that maximizes $p(\cdot|x)$. In the more general case, if $(G^{(X)}, G^{(Y)})$ are the 1-level groups described by $(\gamma_X(X), \gamma_Y(Y))$, the above conditions allow instantaneous decoding of the description of $G^{(X)}$ and $G^{(Y)}$. A decoding error occurs if and only if there is more than one pair of $(x,y) \in G^{(X)} \times G^{(Y)}$ with $p(x,y)>0$. In this case, the decoder reconstructs the symbols as arg $\max_{(x,y) \in G^{(x)} \times G^{(y)}} p(x,y)$.

Decoding Error Probability and Distortion Analysis

As discussed above, the benefit of near-lossless coding is a potential savings in rate. The cost of that improvement is the associated error penalty, which we quantify here.

By Lemma 6, any 1-level group $G \subseteq Y$ is a legitimate group in near-lossless side-information coding of Y given X. The minimal penalty for a code with $\gamma_Y(Y) = \gamma_Y(Y')$ for all $y,y' \in G$ is $$P_e(\mathcal{G}) = \sum_{x \in \mathcal{X}} \left[ \sum_{y \in \mathcal{G}} p(x, y) - \max_{y \in \mathcal{G}} p(x, y) \right].$$

This minimal error penalty is achieved by decoding the description of G to $y=\arg \max_{y' \in G} p(x,y')$ when X=x. Multi-level group G=(R:C(R)) is a legitimate group for side-information coding of Y given X if and only if for any $x \in X$ and $y \in R$, $y' \in C(R)$ implies $p(x,y)p(x,y')=0$. In this case, $$Pe(\mathcal{G}) = \sum_{n \in \mathcal{T}(\mathcal{G})} Pe(n).$$

That is, the error penalty of a multi-level group equals the sum of the error penalties of the 1-level groups it contains. Thus for any partition P(Y) satisfying the near-lossless MASC prefix property, $$Pe(\mathcal{P}(y)) = \sum_{n \in \mathcal{T}(\mathcal{P}(1)y)} Pe(n).$$

Similarly, given a partition P(X), a 1-level group $G \subseteq Y$ is a legitimate group for a general near-lossless MASC given P(X) if for any y,y'∈G, y and y' do not both belong to $A_x \cup A_{x'}$ for any x,x' such that $\gamma_X(X) \leq \gamma_X(X')$. A multi-level group G=(R:C(R)) on Y is a legitimate group for a general near-lossless MASC if R and all members of C(R) are legitimate, and for any y∈R and y'∈C(R), y and y' do not both belong to $A_x \cup A_{x'}$ for any x,x' such that x is a prefix of x'.

For any pair of nodes $n_x \in T(P(X))$ and $n_y \in T(P(Y))$, the minimal penalty for $(n_x, n_y)$ is $$Pe(n_x, n_y) = \sum_{(x,y) \in n_x \times n_y} p(x,y) - \max_{(x,y) \in n_x \times n_y} p(x,y).$$

Decoding the description of $n_x$ and $n_y$ to arg $\max_{x \in n_x, y \in n_y} \{p(x,y)\}$ gives this minimal error penalty. Thus the minimal penalty for using partition pair (P(X), P(Y)) satisfying the near-lossless MASC prefix property is $$P_e(P(X), P(Y)) = \sum_{n_x \in T(P(X)), n_y \in T(P(Y))} P_e(n_x, n_y).$$

Since near-lossless coding may be of most interest for use in lossy coding, probability of error may not always be the most useful measure of performance in a near-lossless code. In lossy codes, the increase in distortion caused by decoding errors more directly measures the impact of the error. We next quantify this impact for a fixed distortion measure d(a, â)>0. If d is the Hamming distortion, then the distortion analysis is identical to the error probability analysis.

In side information coding of Y given X, the minimal distortion penalty for 1-level group G is $$D(\mathcal{G}) = \sum_{x \in \mathcal{X}} \min_{\hat{y} \in \mathcal{G}} \sum_{y \in \mathcal{G}} p(x,y) d(y, \hat{y}).$$

This value is achieved when the description of G is decoded to arg $\min_{\hat{y} \in G} \sum_{y \in G} p(x,y) d(y, \hat{y})$ when X=x. Thus for any partition P(Y) satisfying the near-lossless MASC prefix property, the distortion penalty associated with using this near-lossless code rather than a lossless code is $$D(\mathcal{P}(y)) = \sum_{n \in T(\mathcal{P}(y))} D(n)$$

In general near-lossless MASC coding, the corresponding distortion penalty for any partition (P(X), P(Y)) that satisfies the near-lossless MASC prefix property is $$D(\mathcal{P}(x), \mathcal{P}(y)) = $$

$$\sum_{n_x \in T(\mathcal{P}(x))} \sum_{n_y \in T(\mathcal{P}(y))} \min_{\hat{x} \in n_x, \hat{y} \in n_y} \sum_{x \in n_x, y \in n_y} p(x,y) [d(x, \hat{x}) + d(y, \hat{y})].$$

Partition Design

In near-lossless coding, any combination of symbols creates a legitimate 1-level group G (with some associated error $P_e(G)$ or $D(G)$). Thus one way to approach near-lossless MASC design is to consider all combinations of 1-level groups that yield an error within the allowed error limits, in each case design the optimal lossless code for the reduced alphabet that treats each such 1-level group G as a single symbol $\tilde{x}_G$ ($\tilde{x}_G \notin X$ if |G|>1) or $\tilde{y}_G$ ($\tilde{y}_G \notin Y$ if |G|>1), and finally choose the combination of groups that yields the lowest expected rates. Considering all combinations of groups that meet the error criterion guarantees an optimal solution since any near-lossless MASC can be described as a lossless MASC on a reduced alphabet that represents each lossy 1-level group by a single symbol.

For example, given a 1-level group $G=(x_1, \ldots, x_m) \subseteq X$ we can design a near-lossless MASC with error probability $P_e(G)$ by designing a lossless MASC for alphabets $\tilde{X} = X \cap \{x_1, \ldots, x_m\}^c \cup \{\tilde{x}_G\}$ and Y and p.m.f.

$$\tilde{p}(x,y) = \begin{cases} p(x,y) & \text{if } x \in \tilde{X} \cap X \\ \sum_{i=1}^m p(x_i, y) & \text{if } x = \tilde{x}_G \end{cases}.$$

Thus designing a near-lossless MASC for p(x,y) that uses only one lossy group G is equivalent to designing a lossless MASC for the probability distribution $\tilde{p}(x,y)$, where the matrix describing $\tilde{p}(x,y)$ can be achieved by removing from the matrix describing p(x,y) the rows for symbols $x_1, \ldots, x_m \in G$ and adding a row for $\tilde{x}_G$. The row associated with $\tilde{x}_G$ equals the sum of the rows removed. Similarly, building a near-lossless MASC using 1-level group $G \subseteq Y$ is equivalent to building a lossless MASC for a p.m.f in which we remove the columns for all y∈G and include a column that equals the sum of those columns.

Multiple (non-overlapping) 1-level groups in X or Y can be treated similarly. In using groups $G_1, G_2 \subset X$, the error probability adds, but in using groups $G_X \subseteq X$ and $G_y \subseteq Y$ the effect on the error probability is not necessarily additive. For example, if $G_X=(x_1, \ldots, x_m)$ and $G_y=(y_1, \ldots, y_k)$ then the error penalty is $$P_e(\mathcal{G}_X, \mathcal{G}_y) = \sum_{y \in \mathcal{Y} - \tilde{C}} \left( \sum_{x \in \tilde{R}} p(x,y) - \max_{x \in \tilde{R}} p(x,y) \right) +$$

$$\sum_{x \in \mathcal{X} - \tilde{R}} \left( \sum_{y \in \tilde{C}} p(x,y) - \max_{y \in \tilde{C}} p(x,y) \right) + \sum_{x \in \tilde{R}} \sum_{y \in \tilde{C}} p(x,y) - \max_{x \in \tilde{R}, y \in \tilde{C}} p(x,y)$$

where $\tilde{R}=\{x_1, \ldots, x_m\}$ and $\tilde{C}=\{y_1, \ldots, y_k\}$. Since using just $G_X$ gives and using just $G_y$ gives $$P_e(\mathcal{G}_X) = \sum_{y \in \mathcal{Y}} \left( \sum_{x \in \tilde{R}} p(x,y) - \max_{x \in \tilde{R}} p(x,y) \right),$$

$$P_e(\mathcal{G}_y) = \sum_{x \in \mathcal{X}} \left( \sum_{y \in \tilde{C}} p(x,y) - \max_{y \in \tilde{C}} p(x,y) \right),$$

we have $$P_e(G_X, G_Y) = P_e(G_X) + P_e(G_Y) - \delta(G_X, G_Y),$$

where $$\delta(\mathcal{G}_x, \mathcal{G}_y) = \sum_{x \in \tilde{R}} \sum_{y \in \tilde{C}} p(x, y) + \quad (9)$$

$$\max_{x \in \tilde{R}, y \in \tilde{C}} p(x, y) - \left( \sum_{y \in \tilde{C}} \max_{x \in \tilde{R}} p(x, y) + \sum_{x \in \tilde{R}} \max_{y \in \tilde{C}} p(x, y) \right)$$

is not necessarily equal to zero. Generalizing, the above results to multiple groups $G_{X,1}, \ldots, G_{X,M}$ and $G_{Y,1}, \ldots, G_{Y,K}$ corresponding to row and column sets $\{\tilde{R}_1, \tilde{R}_2, \ldots, \tilde{R}_M\}$ and $\{\tilde{C}_1, \tilde{C}_2, \ldots, \tilde{C}_K\}$ respectively gives total error penalty $$P_e(\{\mathcal{G}_{x,1}, \mathcal{G}_{x,2}, \ldots, \mathcal{G}_{x,M}\}, \{\mathcal{G}_{y,1}, \mathcal{G}_{y,2}, \ldots, \mathcal{G}_{y,K}\}) = \quad (10)$$

$$\sum_{i=1}^{M} P_e(\mathcal{G}_{x,i}) + \sum_{j=1}^{K} P_e(\mathcal{G}_{y,j}) - \sum_{i=1}^{M} \sum_{j=1}^{K} \delta(\mathcal{G}_{x,i}, \mathcal{G}_{y,j}).$$

Here $$P_e(\{\mathcal{G}_{x,1}, \mathcal{G}_{x,2}, \ldots, \mathcal{G}_{x,M}\}, \{\mathcal{G}_{y,1}, \mathcal{G}_{y,2}, \ldots, \mathcal{G}_{y,K}\}) \geq$$

$$\max \left\{ \sum_{i=1}^{M} P_e(\mathcal{G}_{x,i}), \sum_{j=1}^{K} P_e(\mathcal{G}_{y,j}) \right\}.$$

Using these results, we give our code design algorithm as follows.

In near-lossless coding of source X given side information Y, we first make a list $L_{X,\epsilon}$ of all lossy 1-level groups of X that result in error at most $\epsilon$ (the given constraint). (The earlier described lossless MASC design algorithm will find all zero-error 1-level groups.) Then a subset $S_{X,\epsilon}$ of that $L_{X,\epsilon}$ such that $S_{X,\epsilon}$ is non-overlapping and result in error at most $\epsilon$ is a combination of lossy 1-level groups with total error at most $\epsilon$. For each $S_{X,\epsilon}$, obtain the reduced alphabet $\tilde{X}$ and p.m.f $\tilde{p}(x,y)$ by representing each group $G \in S_{X,\epsilon}$ by a single symbol $\tilde{x}_G$ as we described earlier. Then perform lossless side information code design of $\tilde{X}$ on $\tilde{p}(x,y)$. After all subsets $S_{X,\epsilon}$ are traversed, we can find the lowest rate for coding X that results in error at most $\epsilon$. Near-lossless coding of Y with side information X can be performed in a similar fashion.

To design general near-lossless MASCs of both X and Y, we first make a list $L_{X,\epsilon}$ of all 1-level groups of X that result in error at most $\epsilon$, and a list $L_{Y,\epsilon}$ of all 1-level groups of Y that result in error at most $\epsilon$. (We include zero-error 1-level groups here, since using two zero-error 1-level groups $G_X \subseteq X$ and $G_Y \subseteq Y$ together may result in non-zero error penalty.) Second, we make a list $L_{S_{X,\epsilon}} = \emptyset \cup \{S_{X,\epsilon} \subseteq L_{X,\epsilon} : S_{X,\epsilon}$ is non-overlapping, $P_e(S_{X,\epsilon}) \leq \epsilon\}$ of all combinations of 1-level groups of X that yield an error at most $\epsilon$, and a list $L_{S_{Y,\epsilon}} = \emptyset \cup \{S_{Y,\epsilon} \subseteq L_{Y,\epsilon} : S_{Y,\epsilon}$ is non-overlapping, $P_e(S_{Y,\epsilon}) \leq \epsilon\}$ of all combinations of 1-level groups of Y that yield an error at most $\epsilon$. (We include $\emptyset$ in the lists to include side information coding in general coding.) Then for each pair $(S_{X,\epsilon}, S_{Y,\epsilon})$, we calculate the corresponding $\delta$ value and the total error penalty using formula (9) and (10). If the total error penalty is no more than $\epsilon$ we obtain the reduced alphabet $\tilde{X}$, $\tilde{Y}$ and p.m.f. $\tilde{p}(x,y)$ described by $(S_{X,\epsilon}, S_{Y,\epsilon})$, then perform lossless MASC design on $\tilde{p}(x,y)$. After all pairs of $(S_{X,\epsilon}, S_{Y,\epsilon}) \in L_{S_X,\epsilon} \times L_{S_Y,\epsilon}$ are traversed, we can trace out the lower boundary of the achievable rate region.

An Alternative Algorithm Embodiment

We next describe an alternative method of code design. The following notation is useful to the description of that algorithm.

The approach described below assumes a known collection of decisions on which symbols of Y can be combined. If we are designing a side-information code, these decisions arise from the assumption that source X is known perfectly to the decoder and thus the conditions described in the section—"Lossless Side-Information Coding" apply. If we are designing a code for Y given an existing code for X, these conditions arise from the MASC prefix condition in Lemma 6.

The algorithm also relies on an ordering of the alphabet Y denoted by $Y = \{y_1, y_2, \ldots, y_N\}$ Here $N = |Y|$ is the number of symbols in Y, and for any $1 \leq i < j \leq N$, symbol $y_i$ is placed before symbol $y_j$ in the chosen ordering. Any ordering of the original alphabet is allowed. The ordering choice restricts the family of codes that can be designed. In particular, the constraints imposed by the ordering are as follows:

1. Two symbols can be combined into a one-level group if and only if
   (a) they are combinable
   (b) they hold adjacent positions in the ordering.
2. A one-level group can be combined with the root of a distinct (one- or multi-level) group if and only if
   (a) the combination meets the conditions for combinability
   (b) the groups hold adjacent positions in the ordering.
3. Two (one- or multi-level) groups can be made descendants of a single root if and only if the groups hold adjacent positions in the ordering.
4. The group formed by combining two symbols or two groups occupies the position associated with those symbols or groups in the alphabet ordering. Given that only adjacent symbols can be combined, there is no ambiguity in the position of a group.

We discuss methods for choosing the ordering below.

Finally, we define a function f used in the code design. For any $i \leq j$, let $P[i,j] = \sum_{k=i}^{j} P_Y(Y_k)$ and $G[i,j]$ denote the group that occupies positions from i to j. When the algorithms begins, only $G[i, i]$ are defined, with $G[i, i] = (y_i)$ for each $i \in \{1, 2, \ldots, N\}$. The values of $G[i,j]$ for each $i < j$ are set as the algorithm runs. The value of $G[1, N]$ when the algorithm is completed is the desired code on the full alphabet. For any $p \in (0,1)$, let $H(p, 1-p) = -p \log p - (1-p) \log (1-p)$. Finally, for any $i \leq j < k$, let $c[i,j,k]$ be defined as follows.

$$c[i, j, k] = \begin{cases} 0 & \text{if } w[i, j] = 0 \text{ and } \mathcal{G}[i, j] \text{ can be combined with the root of } \mathcal{G}[j+1, k] \\ 1 & \text{if } w[i, j] > 0, w[j+1, k] = 0, \text{ and } \mathcal{G}[j+1, k] \text{ can be combined with the root of } \mathcal{G}[i, j] \\ 2 & \text{otherwise} \end{cases}$$

The value of $c[i,j,k]$ describes if the two adjacent groups $G[i,j]$ and $G[j+1, k]$ must be siblings under an empty root (when $c[i,j,k]=2$) or one group can reside at the root of the other group (when c[i,j,k]=0,G[i,j] can reside at the root of G[j+1, k]; when c[i,j,k]=1, G[j+1, k] can reside at the root of G[i,j]). We cannot calculate c[i,j,k] until G[i,j] and G[j+1, k] have been calculated.

The value of f(w[i,j], w[j+1,k]) is the rate of group G[i,k] when we use groups G[i,j] and G[j+1,k] to construct G[i,k]. When G[i,j] can reside at the root of G[j+1,k], f(w[i,j], w[j+1, k]) equals G[j+1, k]'s best rate; when G[j+1, k] can reside at the root of G[i,j], f(w[i,j],w[j+1,k]) equals G[i,j]'s best rate; when G[i,j] and G[j+1, k] must be siblings, f(w[i,j],w[j+1,k]) equals $w^0[i,j,k]$. The best rate of G[i,k] is the minimal value of f(w[i,j], w[j+1, k]) over all $j \in \{i, i+1, \ldots i+L-1\}$. The function f(w[i,j], w[j+1,k]) is calculated as follows:

$$f(w[i, j], w[j+1, k]) = \begin{cases} w[j+1, k] & \text{if } c[i, j, k] = 0 \\ w[i, j] & \text{if } c[i, j, k] = 1 \\ w^0[i, j, k] & \text{if } c[i, j, k] = 2 \end{cases}$$

Here, $$w^0[i, j, k] = \begin{cases} w[i, j] + w[j+1, k] + P[i, k] & \text{in Huffman coding} \\ w[i, j] + w[j+1, k] + P[i, k]H\left(\frac{P[i, j]}{P[i, k]}, \frac{P[j+1, k]}{P[i, k]}\right) & \text{in arithmetic coding} \end{cases}$$

Given the above definitions, we use the following algorithm for code design.

1. Choose an order for alphabet Y. In this step, we simply choose one of the |Y|!/2 distinct orderings of the symbols in Y. (An ordering and its reversal are identical for our purposes.)
2. Initialize w[i,i]=0 and G[i,i]=($y_i$) for all $i \in \{1, 2, \ldots, N\}$
3. For each $L \in \{1, 2, \ldots, N-1\}$
   a. For each $i \in \{1, 2, \ldots, N-L\}$, set $w[i,i+L] = \min_{j \in \{i,i+1,\ldots i+L-1\}} f(w[i,j],w[j+1,i+L])$ b. Let $j^* = \arg\min_{j \in \{i,i+1,\ldots i+L-1\}} f(w[i,j],w[j+1,i+L])$, then set $$G[i, i+L] = \begin{cases} G[i, j^*] \text{ combined with the root of } G[j^*+1, i+L] & \text{if } c[i, j^*, i+L] = 0 \\ G[j^*+1, i+L] \text{ combined with the root of } G[i, j^*] & \text{if } c[i, j^*, i+L] = 1 \\ G[i, j^*] \text{ and } G[j^*+1, i+L] \text{ siblings under empty root} & \text{if } c[i, j^*, i+L] = 2 \end{cases}$$

When the above procedure is complete, G[1, N] is an optimal code subject to the constraints imposed by ordering $\{y_1, y_2, \ldots, y_N\}$ and w[1, N] gives its expected description length.

Figure 13:
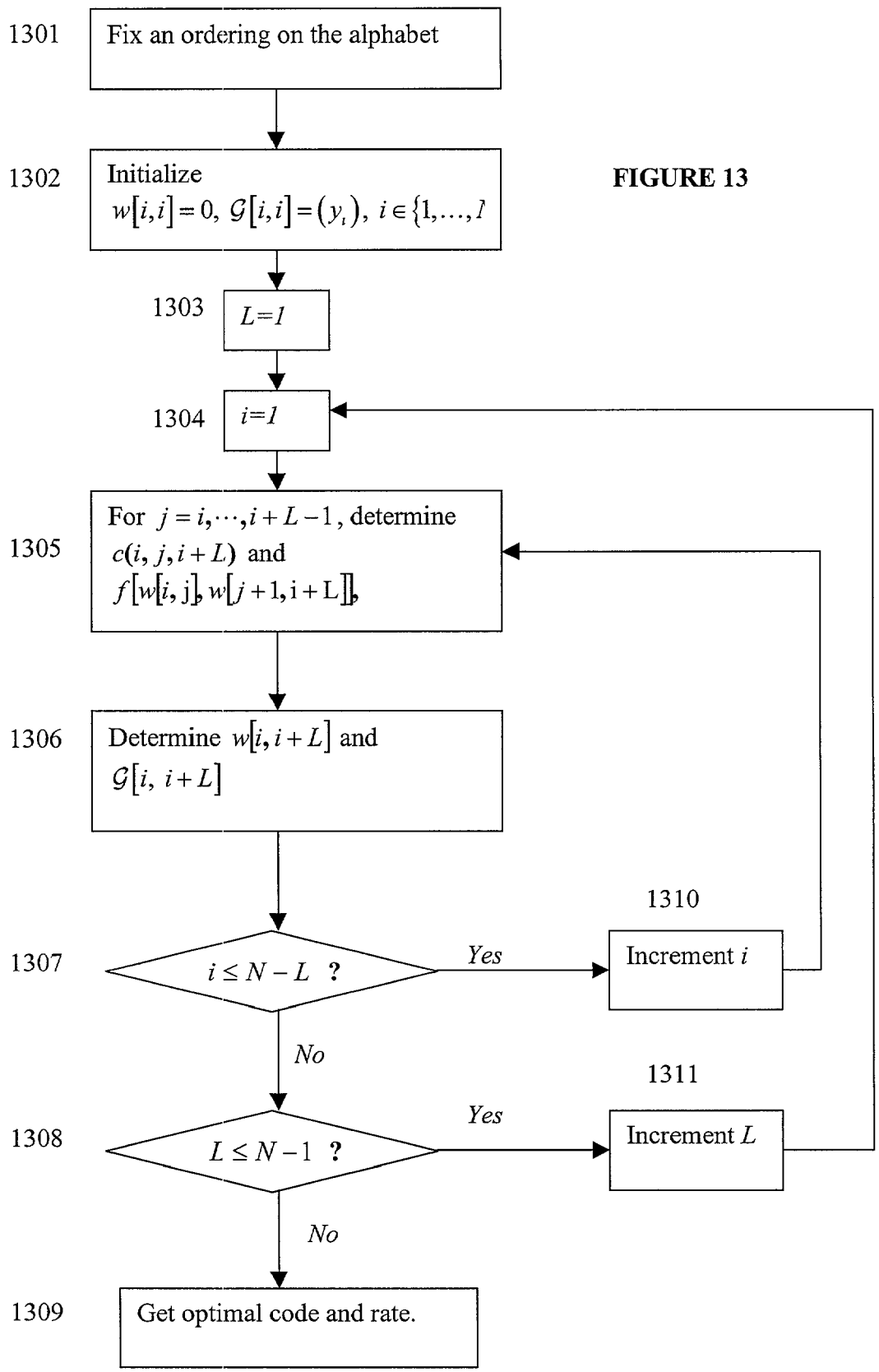
FIG. 13 illustrates a flow chart for a general coding scheme for an alternate algorithm embodiment.

FIG. 13 illustrates the process in the alternate algorithm embodiment. At box 1301, an ordering of the alphabet is fixed. Then at box 1302, the variables (weight, group, etc) are initialized. At box 1303, L is set to 1. At box 1304, i is set to 1. L and i are counter variables for the loop starting at box 1305, which iterates through the ordering and progressively creates larger combination out of adjacent groups until an optimal code for the ordering is obtained. At box 1305, the current combination (i,j,i+L) is checked for combinability. The function f for the combination is also determined at this point. At box 1306 the weight and grouping of the current combination are determined. At box 1307, it is determined whether $i \leq N-L$. If it is then the process increments i at 1310 and returns to box 1305. If not, it proceeds to box 1308 where a determination of whether $L \leq N-1$ is made. If it is then the process increments L and returns to box 1304. If not, the loop is complete and the process terminates at 1309. The optimal code and rate have been obtained.

The algorithm may be used in a number of different ways.
1. The code designer may simply fix the ordering, either to a choice that is believed to be good or to a randomly chosen value, and simply use the code designed for that order. For example, since only symbols that are adjacent can be combined, the designer may choose an ordering that gives adjacent positions to many of the combinable symbols.
2. Alternatively, the designer may consider multiple orderings, finding the optimal code for each ordering and finally using the ordering that gives the best expected performance.
3. The designer may also choose a first ordering $\mathcal{O}_1$ at random, find the best code $G(\mathcal{O}_1)$ for this ordering; then for each $m \in \{1,2, \ldots M\}$, the designer could permute ordering $\mathcal{O}_m$ using one or more of the permutation operations described below to find an ordering $\mathcal{O}_{m+1}$; for the given permutation operations, $G(\mathcal{O}_{m+1})$ is guaranteed to be at least as good as $G(\mathcal{O}_m)$, since $\mathcal{O}_{m+1}$ is consistent with $G(\mathcal{O}_m)$. This solution involves running the design algorithm M+1 times. The value of M can be chosen to balance performance and complexity concerns. Here we list four methods to derive a new ordering from an old ordering, such that the new ordering's performance is promised to be at least as good as the old ordering. Suppose the old ordering $\mathcal{O}_m$ is $\{y_1, \ldots, y_N\}$.
   (a) Let G[i,j],G[j+1,k] ($i \leq j < k$) be any two subtrees descending from the same parent in $G(\mathcal{O}_m)$. The new ordering $\mathcal{O}_{m+1}$ is $\{y_1, \ldots, y_{i-1}, y_{J+1}, \ldots, y_k, y_i, \ldots, y_J, y_{k+1}, \ldots, y_N\}$.
   (b) Let R[i,j] be the root of subtree G[i,k] ($i \leq j \leq k$) in $G(\mathcal{O}_m)$. The new ordering ($\mathcal{O}_{m+1}$ is $\{y_1, \ldots, y_{i-1}, y_{J+1}, \ldots, y_k, y_i, \ldots, y_J, y_{k+1}, \ldots, y_N\}$.
   (c) Let R[i,j] be the root of subtree G[k,j] ($k < i \leq j$) in $G(\mathcal{O}_m)$. The new ordering $\mathcal{O}_{m+1}$ is $\{y_1, \ldots, y_{k-1}, y_i, \ldots, y_j, y_k, \ldots, y_{i-1}, y_{j+1}, \ldots, y_N\}$.
   (d) Suppose the subroot R[i,j] in $G(\mathcal{O}_m)$ is a one-level group with more than one symbol. Any permutation on the sub-ordering $\{y_i, \ldots, y_J\}$ results in a new ordering.
4. Any combination of random choices and permutations of the ordering can be used.
5. The designer may also be willing to try all orderings to find the optimal code.

Here we note that trying all orderings guarantees the optimal performance. Choosing a sequence of orders at random gives performance approaching the optimal performance in probability.

Huffman Coding Example for the New Algorithm

Table 5 gives another example of the joint probability of source X and Y, with $X=Y=\{a_1, a_2, a_3, a_4, a_5\}$. Suppose X is given as side-information, we now find the optimal Huffman code for Y subject to the constraints imposed by ordering $\{a_1, a_2, a_3, a_4, a_5\}$ on Y.

TABLE 5

|   | Y | | | | |
|---|---|---|---|---|---|
| X | $a_1$ | $a_2$ | $a_3$ | $a_4$ | $a_5$ |
| $a_1$ | 0.1 | 0.0 | 0.0 | 0.0 | 0.0 |
| $a_2$ | 0.0 | 0.1 | 0.0 | 0.0 | 0.1 |
| $a_3$ | 0.0 | 0.0 | 0.1 | 0.15 | 0.2 |
| $a_4$ | 0.05 | 0.0 | 0.0 | 0.0 | 0.0 |
| $a_5$ | 0.0 | 0.0 | 0.05 | 0.1 | 0.05 |

Initialize: $w[i,i]=0, G[i,i]=(a_i)$, $i \in \{1, \ldots, 5\}$.

L=1:
  $a_1$ and $a_2$ are combinable, so $w[1,2]=0$, $G[1, 2]=(a_1, a_2)$;
  $a_2$ and $a_3$ are combinable, so $w[2,3]=0$, $G[2, 3]=(a_2, a_3)$;
  $a_3$ and $a_4$ are not combinable, so $w[3,4]=P[3,4]=0.4$, $G[3,4]=((\ ):\{(a_3),(a_4)\})$;

$a_4$ and $a_5$ are not combinable, so $w[4,5]=P[4,5]=0.6$, $G[4, 5]=((\ ):\{(a_4), (a_5)\})$.

L=2:
  i=1: $c[1,1,3]=0$ (since $w[1,1]=0$ and $G[1, 1]=(a_1)$ can be combined with the root of $G[2, 3]=(a_2, a_3)$), so $f[w[1,1], w[2,3]]=0$, which is the minimal value.
  Thus $w[1,3]=0$, $G[1, 3]=(a_1, a_2, a_3)$;
  i=2: $c[2, 2, 4]=0$ (since $w[2, 2]=0$ and $G[2, 2]=(a_2)$ can be combined with the root of $G[3, 4]=((\ ):\{(a_3),(a_4)\}))$, so $f[w[2,2], w[3,4]]=w[3,4]=0.4$;
  $c[2, 3, 4]=2$, (since $w[2, 3]=0$ but $G[2, 3]=(a_2, a_3)$ can't be combined with the root of • $G[4, 4]=(a_4)$), so $f[w[2, 3], w[4,4]]=w°[2,3,4]=w[2,3]'P[2,4]=0.5$.
  So, $w[2,4]=0.4$, $G[2, 4]=((a_2):\{(a_3),(a_4)\})$.
  i=3: $c[3, 3, 5]=2$, $f[w,[3,3], w[4,5]]=w°[3,3,5]=w[4,5]+P[3,5]=1.35$;
  $c[3, 4, 5]=2$, (since $w[3,4]>0$, $w[5,5]=0$, but $G[5,5]=(a_5)$ can't be combined with the root of $G[3, 4]=((\ ):\{(a_3), (a_4)\}))$, $f[w[3, 4], w[5, 5]]=w°[3, 4, 5]=w[3,4]+P[3,5]=1.15$.
  So, $w[3,5]=1.15$, $G[3, 5]=((\ ):\{((\ ):\{(a_3), (a_4)\}), (a_5)\})$.

L=3,
  i=1:
  $c[1, 1, 4]=0$, $f[w[1,1], w[2,4]]=w[2,4]=0.4$;
  $c[1, 2, 4]=0$, $f[w[1,2], w[3,4]]=w[3,4]=0.4$;
  $c[1, 3, 4]=2$, $f[w[1,3], w[4,4]]=w°[1,3,4]=w[1,3]+P[1,4]=0.65$.
  So, $w[1,4]=0.4$, $G[1, 4]=((a_1, a_2):\{(a_3), (a_4)\})$.
  i=2:
  $c[2, 2, 5]=2$, $f[w[2,2], w[3,5]]=w°[2,2,5]=w[3,5]+P[2,5]=2$;
  $c[2, 3, 5]=2$, $f[w[2,3], w[4,5]]=w°[2,3,5]=w[4,5]+P[2,5]=1.45$;

$c[2, 4, 5]=2$, $f[w[2,4], w[5,5]]=w°[2,4,5]=w[2,4]+P[2,5]=1.25$.
So, $w[2,5]=1.25$, $G[2, 5]=((\ ):\{((a_2):\{(a_3), (a_4)\}), (a_5)\})$.

L=4:
  i=1:
  $c[1, 1, 5]=0$, $f[w[1,1], w[2,5]]=w[2,5]=1.25$;
  $c[1, 2, 5]=2$, $f[w[1,2], w[3,5]]=w°[1,2,5]=w[3,5]+P[1,5]=2.15$;
  $c[1, 3, 5]=2$, $f[w[1,3], w[4,5]]=w°[1,3,5]=w[4,5]+P[1,5]=1.6$;
  $c[1, 4, 5]=2$, $f[w[1,4], w[5,5]]=w°[1,4,5]=w[1,4]+P[1,5]=1.4$.
  So, $w[1,5]=1.25$, $G[1, 5]=((a_1):\{((a_2):\{(a_3), (a_4)\}), (a_5)\})$.

Thus the optimal Huffman code subject to the constraints imposed by ordering $\{a_1,a_2,a_3,a_4,a_5\}$ on Y is $G[1, 5]=((a_1):\{((a_2):\{(a_3), (a_4)\}), (a_5)\})$, with rate $w[1,5]=1.25$ bits.

Experimental Results

This section shows optimal coding rates for lossless side-information MASCs, lossless general MASCs, and near-lossless general MASCs for the example of Table 3. We achieve these results by building the optimal partitions and matched codes for each scenario, as discussed in earlier sections. Both Huffman and arithmetic coding rates are included.

Table 6 below gives the side-information results for the example of Table 3.

TABLE 6

| H(X) | $R_H(X)$ | H(Y) | $R'_{SI,A}(Y)$ | $R^*_{SI,A}(Y)$ | $R_H(Y)$ | $R'_{SI,H}(Y)$ | $R^*_{SI,H}(Y)$ |
|---|---|---|---|---|---|---|---|
| 2.91412 | 2.97 | 2.91075 | 1.67976 | 1.53582 | 2.96 | 1.75 | 1.67 |

Figure 14:
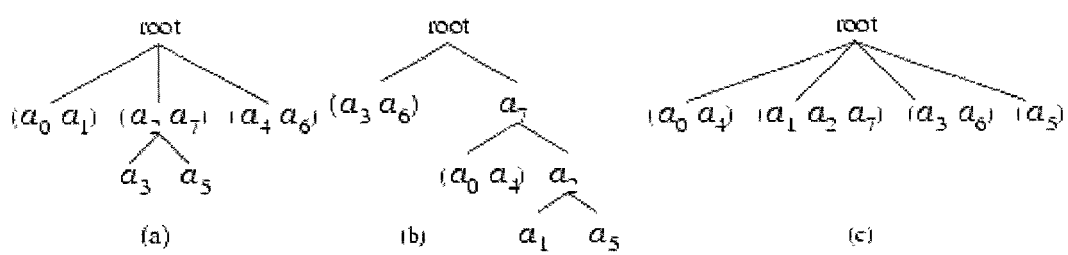
FIG. 14 show a comparison of three partition tress generated from the various embodiments of the present invention.

Here H(X) and $R_H(X)$ are the optimal and Huffman rate for source X when X is coded independently. We use [H(Y), $R'_{SI,A}(Y)$, $R^*_{SI,A}(Y)$] and [$R_H(Y), R'_{SI,H}(Y), R^*_{SI,H}(Y)$] to denote the optimal and Huffman results respectively for [traditional, side-information from results from Jabri and Al-Issa and our side-information] coding on Y. The partition trees achieving these results are shown in FIG. 14. The rate achievable in coding Y using side-information X is approximately half that of an ordinary Huffman code and 90% that of result from [2].

Figure 15:
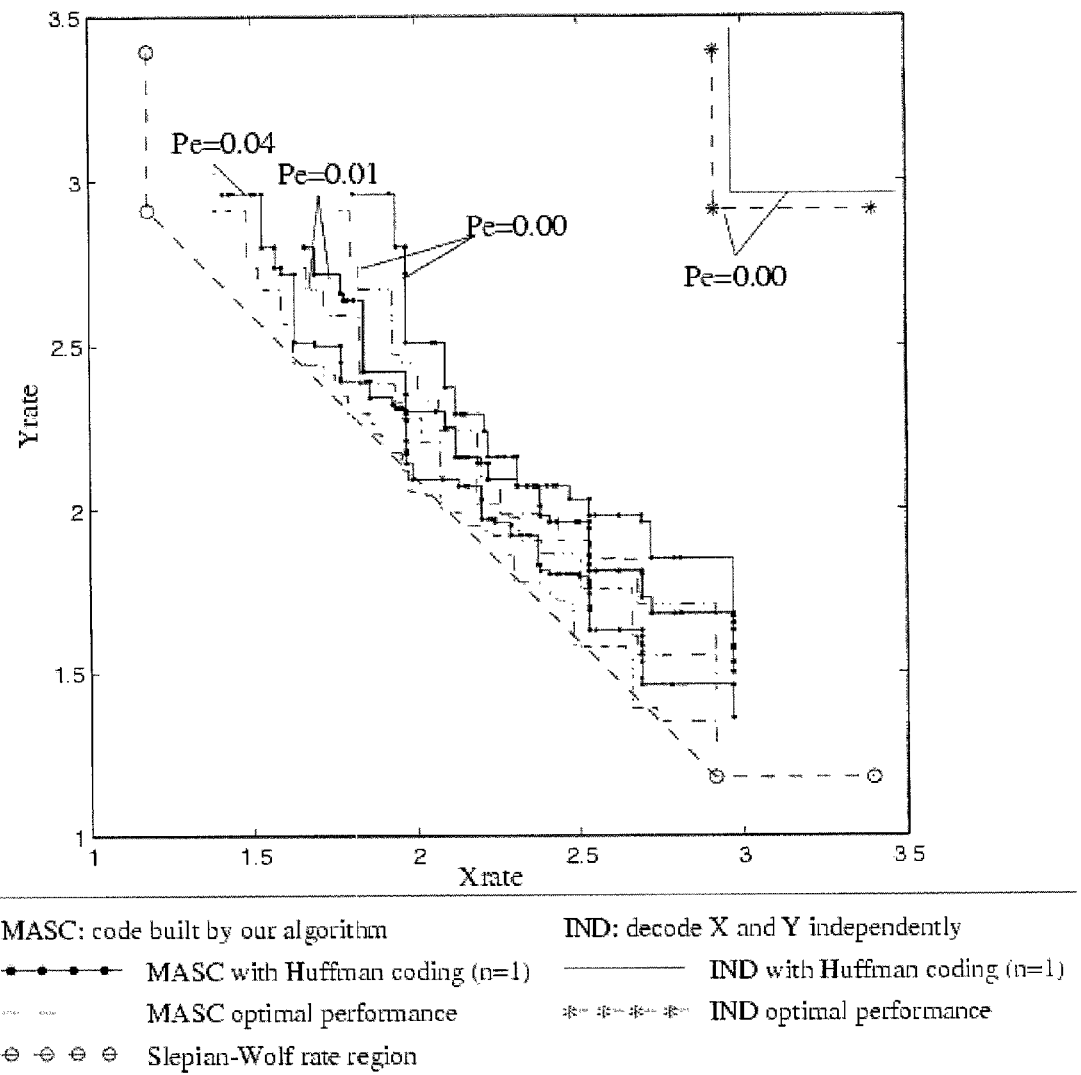
FIG. 15 is a graph of general lossless and near-lossless MASC results.

FIG. 15 shows general lossless and lossy MASC results. The optimal lossless MASC gives significant performance improvement with respect to independent coding of X and Y but does not achieve the Slepian-Wolf region. By allowing error probability 0.01 (which equals $\min_{x,y} p(x,y)$, i.e. the smallest error probability that may result in different rate region than in lossless coding), the achievable rate region is greatly improved over lossless coding, showing the benefits of near-lossless coding. By allowing error probability 0.04, we get approximately to the Slepian-Wolf region for this example.

For the joint probability distribution given in Table 3 of the "Invention Operation" section, we perform the alternative algorithm embodiment (described in the last section) on several orderings of the alphabet $Y=\{A_0,a_1,a_2,a_3,a_4,a_5,a_6,a_7\}$ (considering X is given as side-information).

For Huffman coding, many orderings can achieve the optimal performance ($R_{SI,H}^*(Y)=1.67$), for example, orderings $(a_0, a_1, a_3, a_6, a_2, a_4, a_5, a_7)$, $(a_3, a_6, a_0, a_4, a_2, a_5, a_1, a_7)$, $(a_4, a_6, a_0, a_1, a_3, a_5, a_7, a_2)$, $(a_7, a_2, a_3, a_5, a_4, a_6, a_1, a_0)$, etc, etc. These are just a few examples.

For arithmetic coding, again, many orderings can achieve the optimal performance ($R_{SI,A}^*(Y)=1.53582$), for example, orderings ($a_0$, $a_4$, $a_1$, $a_5$, $a_2$, $a_7$, $a_3$, $a_6$), ($a_1$, $a_5$, $a_2$, $a_0$, $a_4$, $a_7$, $a_6$, $a_3$), ($a_5$, $a_1$, $a_2$, $a_4$, $a_0$, $a_7$, $a_6$, $a_3$), ($a_6$, $a_3$, $a_4$, $a_0$, $a_2$, $a_5$, $a_1$, $a_7$), etc, etc. These are just a few examples.

Table 7 below gives examples of a few randomly chosen orderings' Huffman code rates and arithmetic code rates.

TABLE 7

| Ordering | Huffman code rate | Arithmetic code rate |
| --- | --- | --- |
| ($a_0$, $a_1$, $a_2$, $a_3$, $a_4$, $a_5$, $a_6$, $a_7$) | 2.38 | 2.1709 |
| ($a_1$, $a_2$, $a_4$, $a_6$, $a_0$, $a_5$, $a_3$, $a_7$) | 1.98 | 1.93391 |
| ($a_4$, $a_2$, $a_0$, $a_3$, $a_1$, $a_7$, $a_6$, $a_5$) | 2.35 | 2.04459 |
| ($a_5$, $a_4$, $a_6$, $a_1$, $a_7$, $a_2$, $a_3$, $a_0$) | 2.14 | 1.88941 |
| ($a_6$, $a_4$, $a_3$, $a_5$, $a_1$, $a_7$, $a_0$, $a_2$) | 1.85 | 1.69265 |
| ($a_7$, $a_1$, $a_0$, $a_3$, $a_4$, $a_6$, $a_2$, $a_5$) | 1.8 | 1.77697 |

Thus, an implementation of lossless and near-lossless source coding for multiple access networks is described in conjunction with one or more specific embodiments. The invention is defined by the claims and their full scope of equivalents.

The paper titled "Lossless and Near-Lossless Source Coding for Multiple Access Networks" by the inventors is attached as Appendix A.

The invention claimed is:

1. A method for encoding and decoding first and second data streams comprising:

encoding said first data stream using a first encoder to produce a first optimal lossless encoded data stream;

encoding said second data stream using a second encoder to produce a second optimal lossless encoded data stream, wherein encoding of said second stream satisfies a prefix condition and said prefix condition is satisfied for a code $\gamma_y$ for data source Y given data source X when for each element $x \in X$, and for each element $y' Y \in A_x$, the description of y is not a prefix of the description of y' and where $A_x$ is a set and where $y' \neq y$;

providing said first and second encoded data streams to a receiver wherein said receiver is provided one of said first and second data streams as side-information;

decoding said first and second encoded data streams using a single optimal lossless decoder.

2. The method of claim 1 wherein said code $\gamma_y$ is a matched code.

3. The method of claim 2 wherein said code $\gamma_y$ is an instantaneous, side-information matched code for p(x,y) when $\gamma_y$ is a matched code for some partition P(Y) for p(x,y).

* * * * *